(12) United States Patent
Nien et al.

(10) Patent No.: US 11,805,636 B2
(45) Date of Patent: Oct. 31, 2023

(54) MEMORY DEVICE

(71) Applicant: TAIWAN SEMICONDUCTOR MANUFACTURING CO., LTD., Hsinchu (TW)

(72) Inventors: Yi-Hsin Nien, Hsinchu (TW); Chih-Yu Lin, Taichung (TW); Wei-Chang Zhao, Hsinchu (TW); Hidehiro Fujiwara, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 356 days.

(21) Appl. No.: 17/035,148

(22) Filed: Sep. 28, 2020

(65) Prior Publication Data
US 2021/0398986 A1   Dec. 23, 2021

Related U.S. Application Data

(60) Provisional application No. 63/040,539, filed on Jun. 18, 2020.

(51) Int. Cl.
| H10B 10/00 | (2023.01) |
| H01L 23/522 | (2006.01) |
| H01L 21/8238 | (2006.01) |
| H01L 21/768 | (2006.01) |
| H01L 23/528 | (2006.01) |

(52) U.S. Cl.
CPC ....... *H10B 10/12* (2023.02); *H01L 21/76816* (2013.01); *H01L 21/76877* (2013.01); *H01L 21/823871* (2013.01); *H01L 23/5226* (2013.01); *H01L 23/5283* (2013.01)

(58) Field of Classification Search
CPC .......... H01L 27/1104; H01L 21/76816; H01L 21/76877; H01L 21/823871; H01L 23/5226; H01L 23/5283
See application file for complete search history.

(56) References Cited

U.S. PATENT DOCUMENTS 10,461,086 B2 * 10/2019 Liaw ...................... H10B 10/12
2010/0038616 A1    2/2010 Nagashima et al.
(Continued)

FOREIGN PATENT DOCUMENTS

| TW | 201926337 A | 7/2019 |
| TW | 202006929 A | 2/2020 |
| TW | 202018934 A | 5/2020 |

*Primary Examiner* — Fernando L Toledo
*Assistant Examiner* — Neil R Prasad
(74) *Attorney, Agent, or Firm* — Maschoff Brennan

(57) ABSTRACT

A memory device is disclosed. The memory device includes a first program line and a second program line. A first portion of the first program line is formed in a first conductive layer, and a second portion of the first program line is formed in a second conductive layer above the first conductive layer. A first portion of the second program line is formed in the first conductive layer, and a second portion of the second program line is formed in a third conductive layer above the second conductive layer. A width of at least one of the second portion of the first program line or the second portion of the second program line is different from a width of at least one of the first portion of the first program line or the first portion of the second program line. A method is also disclosed herein.

20 Claims, 16 Drawing Sheets

(56) References Cited

U.S. PATENT DOCUMENTS

| | | |
|---|---|---|
| 2011/0068373 A1 | 3/2011 | Minemura et al. |
| 2011/0204309 A1 | 8/2011 | Nitta |
| 2016/0180929 A1 | 6/2016 | Kang et al. |
| 2016/0314831 A1* | 10/2016 | Liaw .................. H01L 23/53209 |
| 2016/0372182 A1* | 12/2016 | Liaw ....................... G11C 5/063 |
| 2018/0175108 A1 | 6/2018 | Terada |
| 2020/0020411 A1 | 1/2020 | Terada et al. |
| 2020/0176473 A1 | 6/2020 | Yamazaki et al. |

* cited by examiner

MEMORY DEVICE

CROSS-REFERENCE TO RELATED APPLICATION(S)

This application claims the benefit of U.S. Provisional Application Ser. No. 63/040,539, filed Jun. 18, 2020, which is herein incorporated by reference.

BACKGROUND

Static random access memory (SRAM) is one type of semiconductor memory having an array of memory cells. Memory cells arranged in a corresponding row or column are accessed through a corresponding word line and a corresponding bit line. Data may be read from or written to the memory cells through operations of the word lines and the bit lines. The SRAM is designed according to routings, for example, including geometry size or arrangement of the word lines.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
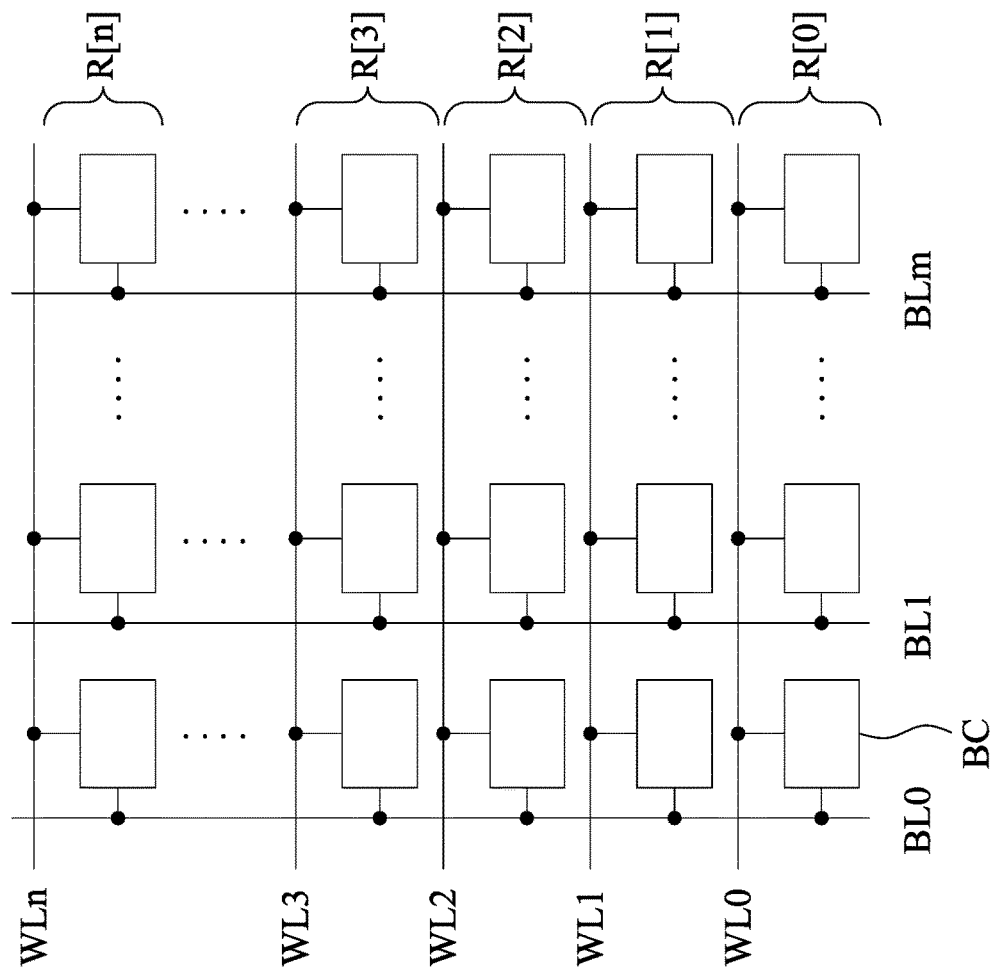
FIG. 1 is a schematic diagram illustrating a memory device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

In this document, the term "coupled" may also be termed as "electrically coupled", and the term "connected" may be termed as "electrically connected". "Coupled" and "connected" may also be used to indicate that two or more elements cooperate or interact with each other.

Furthermore, spatially relative terms, such as "underlying," "below," "lower," "overlying," "upper" and the like, may be used throughout the description for ease of understanding to describe one element or feature's relationship to another element(s) or feature(s) as illustrated in the figures. The spatially relative terms are intended to encompass different orientations of the device in use or operation in addition to the orientation depicted in the figures. The structure may be otherwise oriented (e.g., rotated 90 degrees or at other orientations) and the spatially relative descriptors used herein may likewise be interpreted accordingly.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

FIG. 1 is a schematic diagram illustrating a memory device 100, in accordance with some embodiments of the present disclosure. In some embodiments, the memory device 100 is utilized to write bit data into bit cells BC arranged in an array. These bit data can stored in the bit cells BC. In some embodiments, the memory device 100 is utilized to read the stored bit data from the bit cells BC. As illustrated in FIG. 1, the memory device 100 includes bit cells BC, word lines WL0, WL1, WL2, WL3, . . . , and WLn, and bit lines BL0, BL1, . . . , and BLm. For simplicity, each of the word lines WL0, WL1, WL2, WL3, . . . , and WLn is referenced as WL hereinafter for illustration, because the word lines WL0, WL1, WL2, WL3, . . . , and WLn operate in a similar way in some embodiments. Based on the same reason, each of the bit lines BL0, BL1, . . . , and BLm is referenced as BL hereinafter for illustration. In various embodiments, the word lines WL are also indicated as program lines, and the bit lines BL are also indicated as data lines.

The bit cells BC are arranged in columns and rows. For simplicity of illustration, only one of the bit cells BC is labeled in FIG. 1. Each of the bit cells BC is coupled to one of the word lines WL, and one of the bit lines BL. In some embodiments, each of the bit cells BC is implemented by an SRAM bit cell in a six-transistor (6 T) configuration. In some other embodiments, each of the bit cells BC is implemented by a single port SRAM bit cell. In alternative embodiments, each of the bit cells BC is implemented by a dual port SRAM bit cell. Various configurations of the bit cells BC are within the contemplated scope of the present disclosure.

The bit lines BL are arranged in rows, and the word lines WL are arranged in columns. For example, as illustrated in FIG. 1, the bit lines BL have m columns, and the word lines WL have n rows, for accessing m*n bit cells BC. In writing or reading operations of the memory device 100, in some embodiments, one of the word lines WL is activated to select the bit cells BC arranged in one of the rows R[0], R[1], R[2], R[3], . . . , or R[n]. One of the bit lines BL is activated to select one of the bit cells BC arranged in one of the columns (not labeled) and the selected rows R[0], R[1], R[2], R[3], . . . , or R[n]. As such, one of the bit cells BC is selected to be accessed.

The above numbers of the word lines WL, bit lines BL or bit cells BC are given for illustrative purposes, and various numbers of the word lines WL, the bit lines BL and the bit cells BC are within the contemplated scope of the present disclosure. The configuration of the memory device 100 as illustrated above is also given for illustrative purposes. Various configurations of the memory device 100 are within the contemplated scope of the present disclosure. For example, in various embodiments, the word lines WL are arranged in rows, and the bit lines are arranged in columns.

Each of the word lines WL has separated portions/segments in physical structures, in some embodiments. These separated segments correspond to an equivalent electric line indicated as one of the word lines WL shown in FIG. 1. These separated segments are formed in different metal layers in the memory device 100, and are coupled together for transmitting a corresponding word line signal to the bit cells BC. In some embodiments, some of the word lines WL are arranged in continuous rows and are considered as a first group. Other some of the word lines WL are arranged in other continuous rows and are considered as another group that is disposed adjacent to the first group. This group and the first group have configurations that are the same. For example, as illustrated in FIG. 1, the word lines WL0, WL1, WL2, and WL3 are considered as an original group with a configuration for arranging the corresponding separated segments of the word lines WL0 to WL3. The word lines WL4, WL5, WL6, and WL7 (not shown) are considered as another group disposed next to the original group, and have the same configuration. This configuration of the word lines WL is illustrated in cross-section diagrams and layout diagrams as discussed below.

Figure 2A:
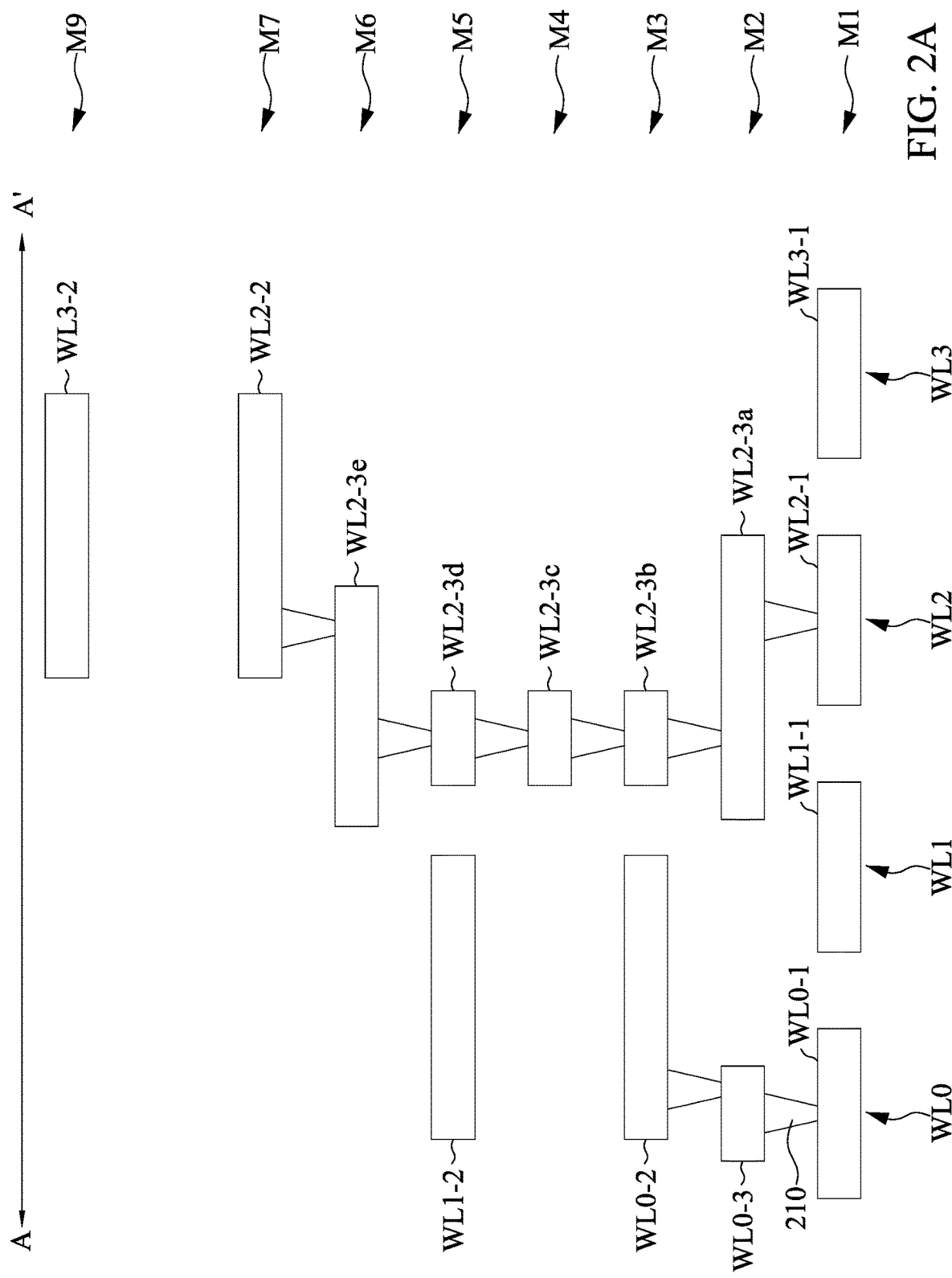
FIGS. 2A and 2B are cross-section schematic diagrams of parts of a memory device corresponding to the memory device shown in FIG. 1, in accordance with some embodiments of the present disclosure.
Figure 2B:
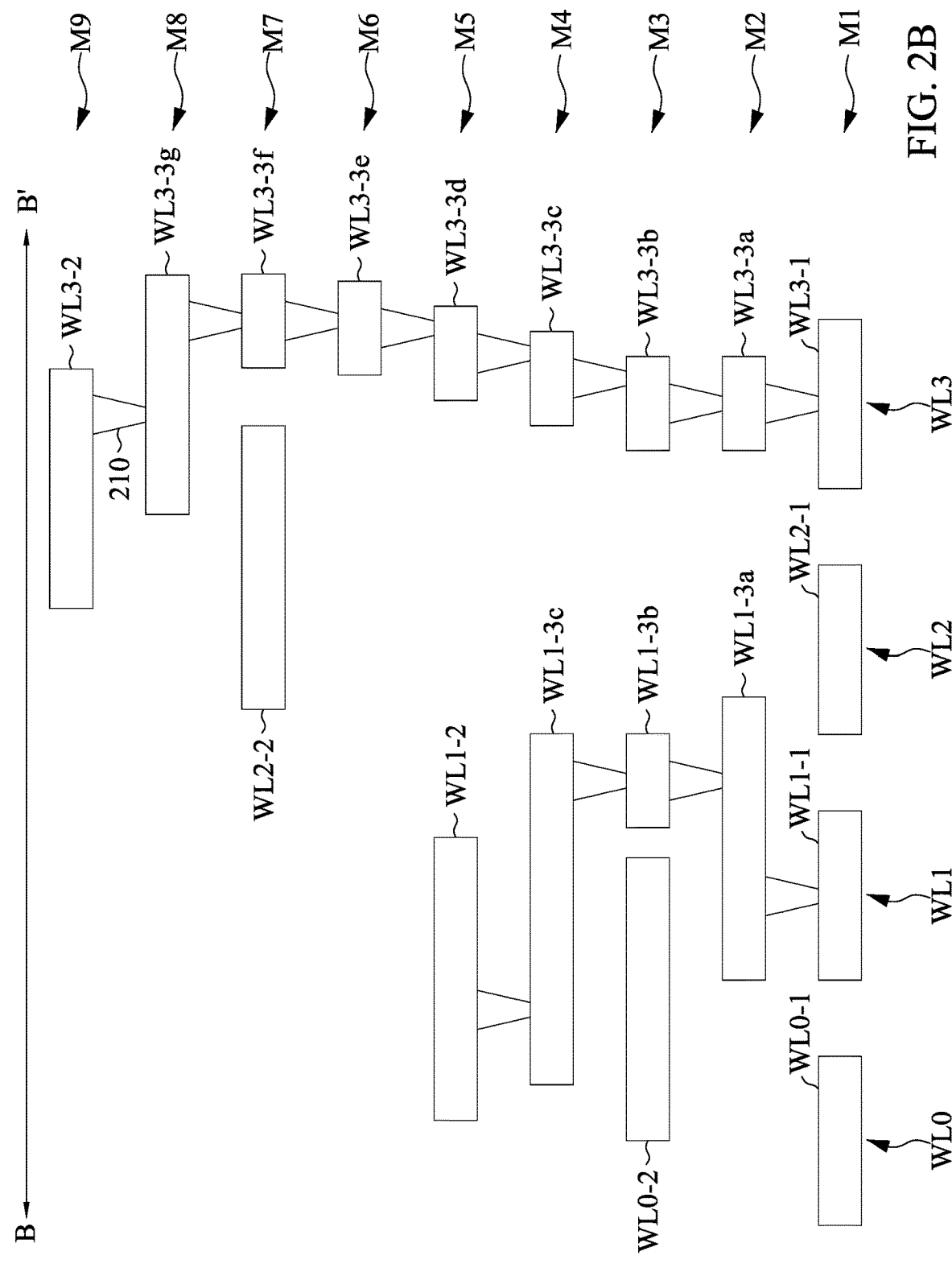

Reference is made to FIGS. 2A and 2B. FIGS. 2A and 2B are cross-section schematic diagrams of parts of a memory device 200 corresponding to the memory device 100 shown in FIG. 1, in accordance with some embodiments of the present disclosure. For ease of understanding, the embodiments with respect to FIG. 2A are discussed with reference to FIG. 2B, and only illustrates elements that are associated with the word lines WL0-WL3. With respect to the embodiments of FIG. 1, like elements in FIGS. 2A and 2B are designated with the same reference numbers for ease of understanding.

As illustrated in FIGS. 2A and 2B, the word lines WL0, WL1, WL2 and WL3 are arranged in continuous metal layers M1, M2, M3, M4, M5, M6, M7, M8 and M9. Each of the word lines WL0-WL3 has at least two portions/segments, and these portions/segments are disposed in different metal layers M1-M9. Each of the word lines WL0-WL3 further includes at least one via 210, and the via 210 is disposed between two adjacent metal layers M1-M9. For simplicity of illustration, only one via 210 is labeled in FIG. 2A or FIG. 2B. The portions/segments of the corresponding word lines WL0-WL3 are coupled to each other through the via 210, for transmitting the corresponding word line signals (not shown).

The word line WL0 has three portions WL0-1, WL0-2 and WL0-3 that are also indicated as segments hereinafter. A segment WL0-1 of the word line WL0 is formed in the M1 layer. Another segment WL0-3 is formed in the M2 layer above the M1 layer. The other segment WL0-2 is formed in the M3 layer above the M2 layer. The segment WL0-1 is coupled through the via 210 disposed between the M1 and M2 layers to the segment WL0-3, and the segment WL0-3 is coupled through the via 210 disposed between the M2 and M3 layers to the segment WL0-2. With such configurations, the segments WL0-1, WL0-2 and WL0-3 are coupled in parallel with each other. Due to different cross-section viewings between FIGS. 2A and 2B, the whole segments of the word line WL0 are only shown in FIG. 2A, and the segments WL0-1 and WL0-3 shown in FIG. 2B are still coupled together by the same configuration as illustrated in FIG. 2A. Based on the same reason, the whole segments of the word lines WL1-WL2 are illustrated in FIG. 2A or FIG. 2B.

Figure 3A:
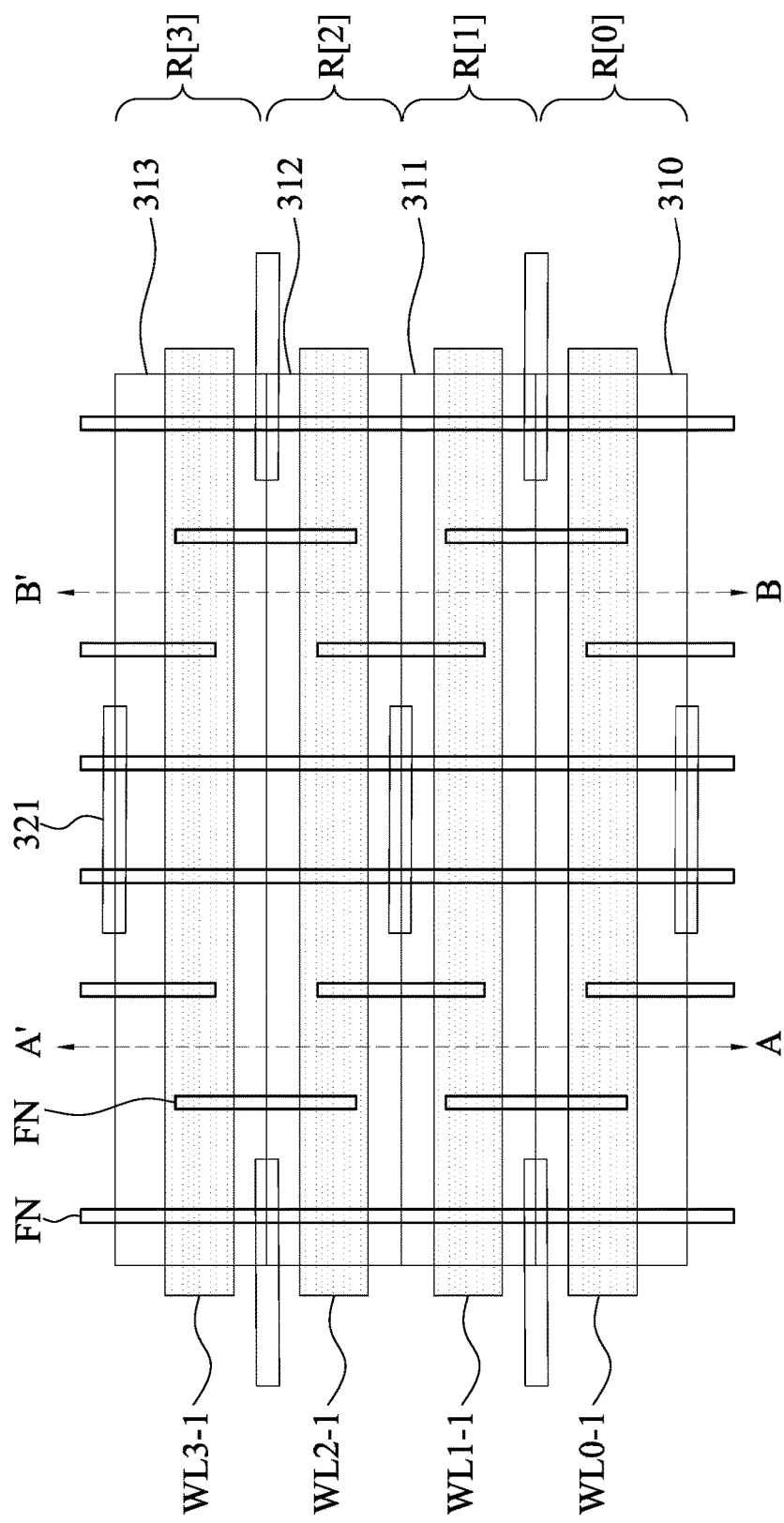
FIGS. 3A to 3E are exemplary diagrams illustrating layout diagrams of parts of a memory device corresponding to the memory device shown in FIGS. 2A and 2B, in accordance with some embodiments of the present disclosure.
Figure 3B:
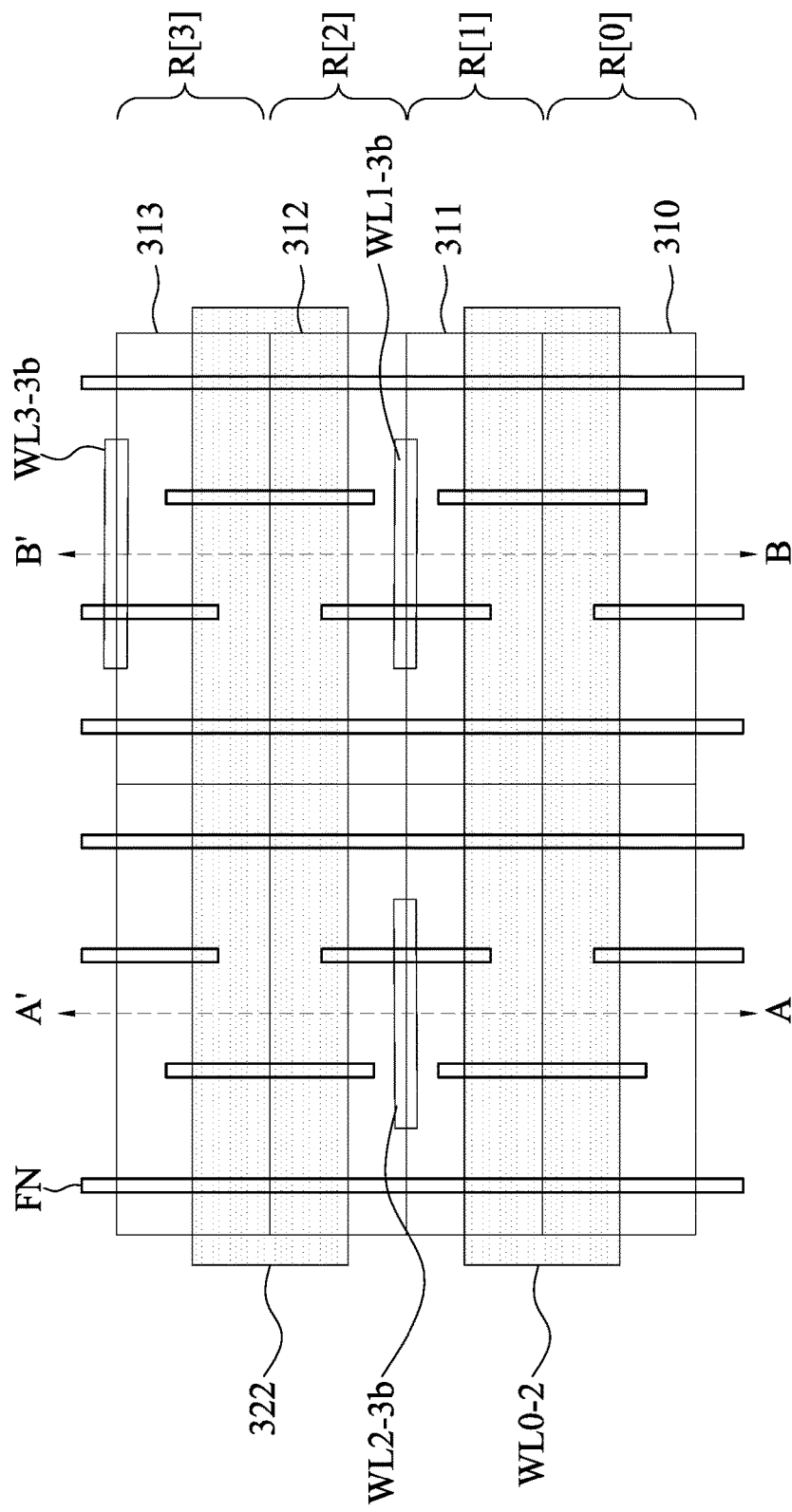

In some embodiments, a length (not illustrated) of the segment WL0-3 is smaller than a length (which is illustrated in FIG. 3A or 3B) of the segment WL0-1 or WL0-2. Furthermore, a length of the segment WL0-1 is substantially equal to a length of the segment WL0-2. With such configurations, the segment WL0-3 is indicated as an interconnection structure, and is configured to couple the segments WL0-1 and WL0-2 together. As such, the segment WL0-3 is further configured to adjust an internal resistance of the word line WL0 by having various sizes. Alternatively stated, an equivalent resistance of the word line WL0 is available to be adjusted by the interconnection structure WL0-3. The segments WL0-1 and WL0-2 are indicated as a pair structures, and are configured to transmit the word line signal to the corresponding bit cells including, for example, the bit cells BC arranged in the row R[0] shown in FIG. 1. Alternatively stated, the segment WL0-1 in the M1 layer and the segment WL0-2 in the M3 layer are two main metal structures of the word line WL0, for transmitting signals.

The word line WL1 has five segments WL1-1, WL1-2, WL1-3a, WL1-3b and WL1-3c. The segment WL1-1 is formed in the M1 layer, and is disposed next to the segment WL0-1. The segment WL1-3a is formed in the M2 layer; the segment WL1-3b is formed in the M3 layer; and the segment WL1-3c is formed in the M4 layer above the M3 layer. The segment WL1-2 is formed in the M5 layer above the M4 layer. The segments WL1-1, WL1-3a, WL1-3b, WL1-3c and WL1-2 are coupled together through the vias 210 disposed between two corresponding metal layers M1-M5.

Figure 3C:
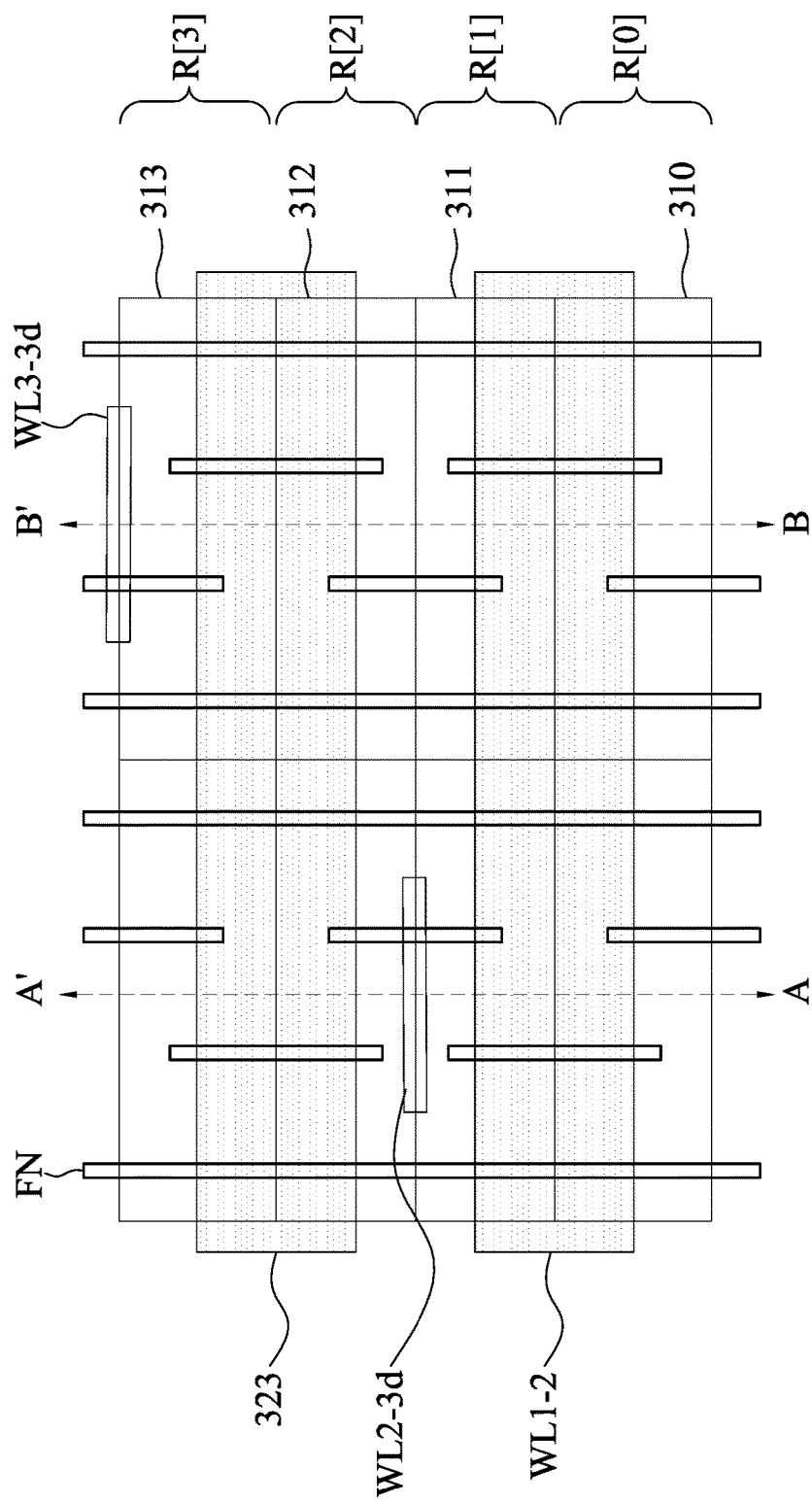

In some embodiments, a length (which is illustrated in FIG. 3A) of the segment WL1-1 is substantially equal to a length (which is illustrated in FIG. 3C) of the segment WL1-2, and is greater than a length (not illustrated) of each of the segments WL1-3a, WL1-3b and WL1-3c. With such configurations, the segments WL1-1 and WL1-2 are indicated as main metal structures of the word line WL1, and the segments WL1-3a, WL1-3b and WL1-3c are indicated as interconnection structures of the word line WL1. The segments WL1-1 and WL1-2 are configured to transmit the word line signal to the corresponding bit cells including, for example, the bit cells BC arranged in the row R[1] shown in FIG. 1. The segments WL1-3a, WL1-3b and WL1-3c are configured to adjust an internal resistance of the word line WL1.

The word line WL2 has seven segments WL2-1, WL2-2, WL2-3a, WL2-3b, WL2-3c, WL2-3d and WL2-3e. The segment WL2-1 is formed in the M1 layer, and is disposed next to the segment WL1-1. The segment WL2-3a is formed in the M2 layer; the segment WL2-3b is formed in the M3 layer; the segment WL2-3c is formed in the M4; the segment WL2-3d is formed in the M5; and the segment WL2-3e is formed in the M6 layer above the M5 layer. The segment WL2-2 is formed in the M7 layer above the M6 layer. The segments WL2-1, WL2-3a, WL2-3b, WL2-3c, WL2-3d, WL2-3e and WL2-2 are coupled together through the vias 210 disposed between two corresponding metal layers M1-M7.

Figure 3D:
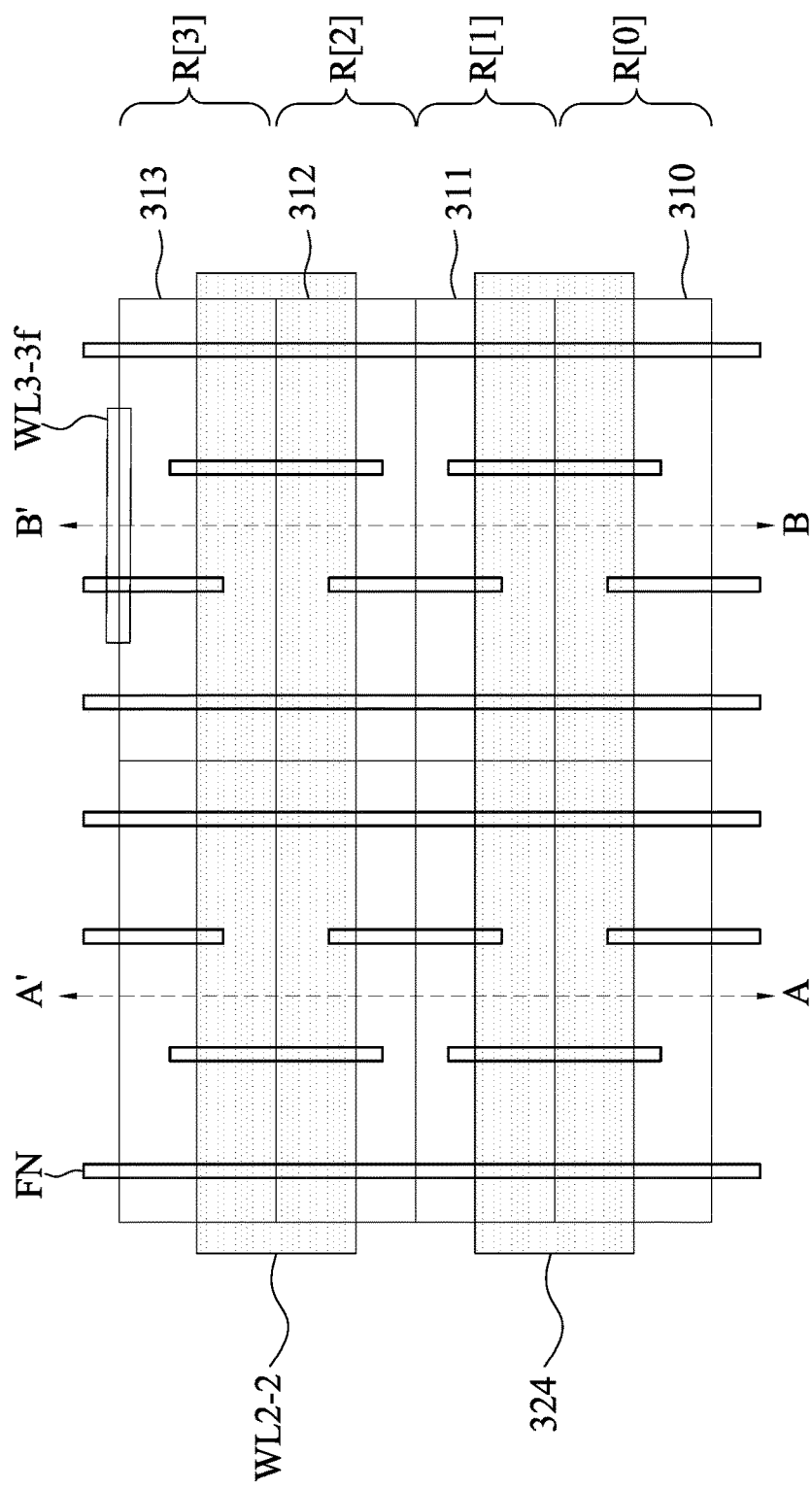

In some embodiments, a length (which is illustrated in FIG. 3A) of the segment WL2-1 is substantially equal to a length (which is illustrated in FIG. 3D) of the segment WL2-2, and is greater than a length (not illustrated) of each of the segments WL2-3a, WL2-3b, WL2-3c, WL2-3d and WL2-3e. With such configurations, the segments WL2-1 and WL2-2 are indicated as main metal structures of the word line WL2, and the segments WL2-3a, WL2-3b, WL2-3c, WL2-3d and WL2-3e are indicated as interconnection structures of the word line WL2. The segments WL2-1 and WL2-2 are configured to transmit the word line signal to the corresponding bit cells including, for example, the bit cells BC arranged in the row R[2] shown in FIG. 1. The segments WL2-3a, WL2-3b, WL2-3c, WL2-3d and WL2-3e are configured to adjust an internal resistance of the word line WL2.

The word line WL3 has nine segments WL3-1, WL3-2, WL3-3a, WL3-3b, WL3-3c, WL3-3d, WL3-3e, WL3-3f and WL3-3g. The segment WL3-1 is formed in the M1 layer, and is disposed next to the segment WL2-1. The segment WL3-3a is formed in the M2 layer; the segment WL3-3b is formed in the M3 layer; the segment WL3-3c is formed in the M4 layer; the segment WL3-3d is formed in the M5; the segment WL3-3e is formed in the M6 layer; the segment WL3-3f is formed in the M7 layer; and the segment WL3-3g is formed in the M8 layer above the M7 layer. The segment WL3-2 is formed in the M9 layer above the M8 layer. The segments WL3-1, WL3-3a, WL3-3b, WL3-3c, WL3-3d, WL3-3e, WL3-3f, WL3-3g and WL3-2 are coupled together through the vias 210 disposed between two corresponding metal layers M1-M9.

Figure 3E:
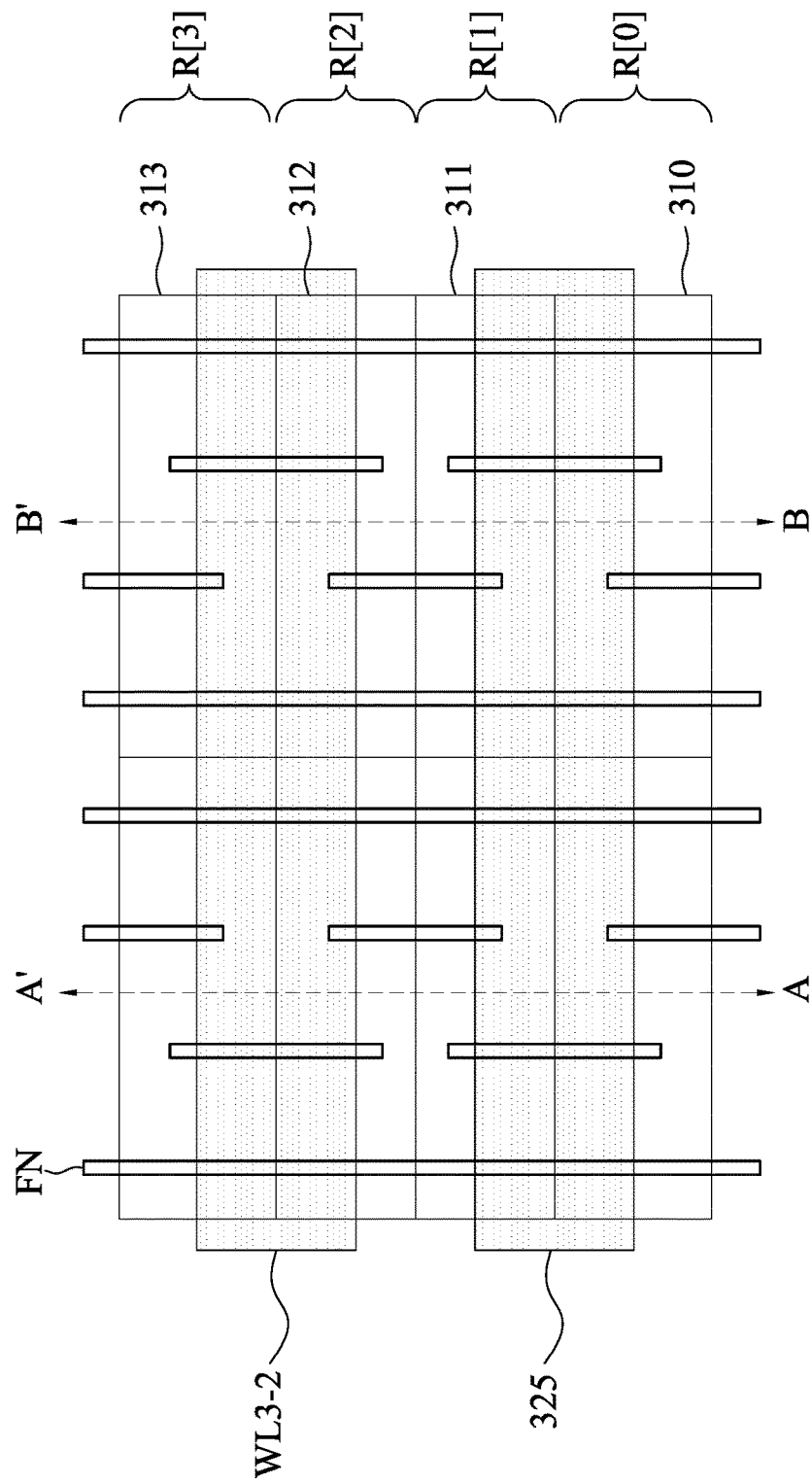

In some embodiments, a length (which is illustrated in FIG. 3A) of the segment WL3-1 is substantially equal to a length (which is illustrated in FIG. 3E) of the segment WL3-2, and is greater than a length (not illustrated) of each of the segments WL3-3a, WL3-3b, WL3-3c, WL3-3d, WL3-3e, WL3-3f and WL3-3g. With such configurations, the segments WL3-1 and WL3-2 are indicated as main metal structures of the word line WL3, and the segments WL3-3a, WL3-3b, WL3-3c, WL3-3d, WL3-3e, WL3-3f and WL3-3g are indicated as interconnection structures of the word line WL3. The segments WL3-1 and WL3-2 are configured to transmit the word line signal to the corresponding bit cells including, for example, the bit cells BC arranged in the row R[3] shown in FIG. 1. The segments WL3-3a, WL3-3b, WL3-3c, WL3-3d, WL3-3e, WL3-3f and WL3-3g are configured to adjust an internal resistance of the word line WL3.

In some embodiments, for each of the word lines WL0-WL3, the segments which are indicated as main metal structures have widths that are different from each other. For example, with reference to FIG. 2A, in the word line WL0, the segment WL0-1 has a width that is smaller than a width of the segment WL0-2. Moreover, the segment WL1-1 of the word line WL1 has width that is smaller than a width of the segment WL1-2 of the word line WL1; the segment WL2-1 of the word line WL2 has width that is smaller than a width of the segment WL2-2 of the word line WL2; and the segment WL3-1 of the word line WL3 has width that is smaller than a width of the segment WL3-2 of the word line WL3. Alternatively stated, these segments of the corresponding word lines WL0-WL3 are considered as a base segment and a roof segment. The base segment is formed in the M1 layer, and is a portion of the corresponding word line in the lowest metal layer. The roof segment is formed in another metal layer above the M1 layer, and is a portion of the corresponding word line in the highest metal layer. For example, with reference to FIG. 2A, for the word line WL0, the segment WL0-1 is referred to as the base segment, and is formed in the M1 layer. The segment WL0-2 is referred to as the roof segment, and is formed in the M3 layer which is the highest metal layer having the word line WL0.

In some embodiments, for the various word lines WL0-WL3, widths of the segments which are indicated as the base segments are the same. For example, with reference to FIG. 2A, widths of the segments WL0-1, WL1-1, WL2-1 and WL3-1 are the same. In some other embodiments, for the various word lines WL0-WL3, widths of the segments which are indicated as the roof segments are the same or different from one another. For example, with reference to FIG. 2A, the segment WL0-2 of the word line WL0 has a width that is same as a width of the segment WL1-2 of the word line WL1. A width of the segment WL1-2 of the word line WL1 is smaller than a width of the segment WL3-2 of the word line WL3, in some embodiments. Alternatively stated, for each of the word lines WL0-WL3, a width of the segment which is formed in the highest metal layer is adjustable.

In some embodiments, for each of the word lines WL0-WL3, at least two of the segments which are indicated as interconnection structures have sizes that are different from one another. For example, with reference to FIG. 2B, in the word line WL1, the segment WL1-3a has a width that is greater than a width of the segment WL1-3b, and is smaller than a width of the segment WL1-3c. In some other embodiments, for the various word lines WL0-WL3, widths/sizes of the segments which are indicated as interconnection structures are the same or different from one another. For example, with reference to FIG. 2A, the segment WL0-3 of the word line WL0 has a width that is same as a width of the segment WL2-3b of the word line WL2. A width of the segment WL2-3b of the word line WL2 is smaller than a width of the segment WL1-3c of the word line WL1, as illustrated in FIGS. 2A and 2B. Alternatively stated, for each of the word lines WL0-WL3, width(s)/size(s) of the segment(s) indicated as interconnection structure(s) is/are adjustable.

The number and arrangement of the metal layers M1-M9 shown in FIGS. 2A-2B are given for illustrative purposes. Various numbers and arrangements of the metal layers M1-M9 to implement the memory device 200 in FIGS. 2A-2B are within the contemplated scope of the present disclosure.

Reference is made to FIGS. 3A-3E. FIGS. 3A-3E are exemplary diagrams illustrating layout diagrams 300A-300E of parts of a memory device corresponding to the memory device 200 shown in FIGS. 2A and 2B, in accordance with some embodiments of the present disclosure. The cross lines A-A' and B-B' shown in FIGS. 3A-3E correspond to the cross line A-A' shown in FIG. 2A and the cross line B-B' shown in FIG. 2B, respectively, in some embodiments. With respect to the embodiments of FIGS. 2A and 2B, like elements in FIGS. 3A-3E are designated with the same reference numbers for ease of understanding. For ease of understanding, the embodiments with respect to FIG. 3A are discussed with reference to FIGS. 2A, 2B and 3B-3E, and only illustrates elements that are associated with the word lines WL0-WL3.

As illustrated in FIG. 3A, a layout diagram 300A illustrates a plan view, viewing a part of the memory device formed in the M1 layer. Continuous bit cells 310, 311, 312 and 313 are arranged in the respective rows R[0], R[1], R[2] and R[3]. The bit cells 310, 311, 312 and 313 correspond to the bit cells BC shown in FIG. 1, in some embodiments. Fins FN are arranged across the bit cells 310, 311, 312 and 313, and extend in the column direction. Some of the fins FN are continuous patterns, and are arranged across the bit cells 310, 311, 312 and 313. Some of the fins FN are separated patterns, and are arranged across two adjacent bit cells 310, 311, 312 or 313. The fins FN correspond to fin structures constructed in transistors that are included in the bit cells BC shown in FIG. 1, in some embodiments. Continuous segments WL0-1, WL1-1, WL2-1 and WL3-1 are arranged in the rows R[0], R[1], R[2] and R[3], respectively. The segments WL0-1, WL1-1, WL2-1 and WL3-1 extend in the row direction, and are arranged across the bit cells 310, 311, 312 and 313, respectively. The segments WL0-1, WL1-1, WL2-1 and WL3-1 are portions of the corresponding word lines. As illustrated in FIG. 3A, a cross section view of the layout diagram 300A along the cross line A-A' corresponds to the structures in the M1 layer as discussed above in FIG. 2A, and the cross section view of the layout diagram 300A along the cross line B-B' corresponds to the structures in the M1 layer as discussed above in FIG. 2B.

Furthermore, power segments 321 are arranged across boundaries of the bit cells 310, 311, 312 and 313, and are arranged between the segments WL0-1, WL1-1, WL2-1 and WL3-1. The power segments 321 extend in the row direction. The power segments 321 are separated from each other, and are separated from the segments WL0-1, WL1-1, WL2-1 and WL3-1. The power segments 321 correspond to metal segments included in the memory device, in some embodiments. These metal segments are coupled to a power source, and are configured to receive power signals from the power source and to provide the power signals to other elements in the memory device. The power signals have a voltage at logic high, or have a voltage at logic low as a ground, in various embodiments.

As illustrated in FIG. 3B, a layout diagram 300B illustrates a plan view, viewing a part of the memory device formed in the M3 layer. Segments WL0-2, WL1-3b, WL2-3b and WL3-3b are separated from each other. The segment WL0-2 is arranged across the bit cells 310 and 311. The segment WL1-3b is arranged at boundaries of the bit cells 311 and 312. The segment WL2-3b is arranged at boundaries of the bit cells 311 and 312. The segment WL3-3b is arranged at boundaries of the bit cell 313 and another bit cell (not shown) in the next row. As illustrated in FIG. 3B, a cross section view of the layout diagram 300B along the cross line A-A' corresponds to the structures in the M3 layer as discussed above in FIG. 2A, and the cross section view of the layout diagram 300B along the cross line B-B' corresponds to the structures in the M3 layer as discussed above in FIG. 2B.

Furthermore, a power line 322 is arranged across the bit cells 312 and 313, and extends in the row direction. The power line 322 is separated from the segments WL0-2, WL1-3b, WL2-3b and WL3-3b. Specifically, the power line 322 is arranged between the segment WL3-3b and the segments WL2-3d and WL1-3b. The segment WL2-3d or WL1-3b is arranged between the power line 322 and the segment WL0-2. In some embodiments, the power line 322 corresponds to a metal line included in the memory device, which is configured to receive and provide a power signal. In various embodiments, the power line 322 in the M3 layer and the power segments 321 in the M1 layer are configured to receive and provide power signals with the same voltage including, for example, the ground.

As illustrated in FIG. 3C, a layout diagram 300C illustrates a plan view, viewing a part of the memory device formed in the M5 layer. Segments WL1-2, WL2-3d and WL3-3d are separated from each other. The segment WL1-2 is arranged across the bit cells 310 and 311. The segment WL2-3d is arranged at boundaries of the bit cells 311 and 312. The segment WL3-3d is arranged at boundaries of the bit cell 313 and another bit cell (not shown) in the next row. As illustrated in FIG. 3C, a cross section view of the layout diagram 300C along the cross line A-A' corresponds to the structures in the M5 layer as discussed above in FIG. 2A, and the cross section view of the layout diagram 300C along the cross line B-B' corresponds to the structures in the M5 layer as discussed above in FIG. 2B.

Furthermore, a power line 323 is arranged across the bit cells 312 and 313, and extends in the row direction. The power line 323 is separated from the segments WL1-2, WL2-3d and WL3-3d. Specifically, the power line 323 is arranged between the segments WL3-3d and WL2-3d, and the segment WL2-3d is arranged between the power line 323 and the segment WL1-2. In some embodiments, the power line 323 corresponds to a metal line included in the memory device. In some other embodiments, the power line 323 in the M5 layer, the power line 322 in the M3 layer and the power segments 321 in the M1 layer have the same configuration indicated as the ground.

As illustrated in FIG. 3D, a layout diagram 300D illustrates a plan view, viewing a part of the memory device formed in the M7 layer. Segments WL2-2 and WL3-3f are separated from each other. The segment WL2-2 is arranged across the bit cells 312 and 313. The segment WL3-3f is arranged at boundaries of the bit cell 313 and another bit cell (not shown) in the next row. As illustrated in FIG. 3D, a cross section view of the layout diagram 300D along the cross line A-A' corresponds to the structures in the M7 layer as discussed above in FIG. 2A, and the cross section view of the layout diagram 300D along the cross line B-B' corresponds to the structures in the M7 layer as discussed above in FIG. 2B.

Furthermore, a power line 324 is arranged across the bit cells 310 and 311, and extends in the row direction. The power line 324 is separated from the segments WL2-2 and WL3-3f. Specifically, the segment WL2-2 is arranged between the segment WL3-3f and the power line 324. In some embodiments, the power line 324 corresponds to a metal line included in the memory device. In some other embodiments, the power line 324 in the M7 layer, the power line 323 in the M5 layer, the power line 322 in the M3 layer and the power segments 321 in the M1 layer have the same configuration indicated as the ground.

As illustrated in FIG. 3E, a layout diagram 300E illustrates a plan view, viewing a part of the memory device formed in the M9 layer. Segment WL3-2 is arranged across the bit cells 312 and 313. As illustrated in FIG. 3E, a cross section view of the layout diagram 300E along the cross line A-A' corresponds to the structures in the M9 layer as discussed above in FIG. 2A, and the cross section view of the layout diagram 300E along the cross line B-B' corresponds to the structures in the M9 layer as discussed above in FIG. 2B.

Furthermore, a power line 325 is arranged across the bit cells 310 and 311, and extends in the row direction. The power line 325 is separated from the segment WL3-2. In some embodiments, the power line 325 corresponds to a metal line included in the memory device. In some other embodiments, the power line 325 in the M9 layer, the power line 324 in the M7 layer, the power line 323 in the M5 layer, the power line 322 in the M3 layer and the power segments 321 in the M1 layer have the same configuration indicated as the ground.

With reference to FIGS. 3A-3B, in some embodiments, in a layout view, the segment WL0-2 is overlapped with the segments WL0-1 and WL1-1, and it is also illustrated in FIGS. 2A and 2B. In addition, the power line 322 is overlapped with the segments WL2-1 and WL3-1. Each of the segment WL0-2 and the power line 322 is partially overlapped with some of the power segments 321.

With reference to FIGS. 3A-3C, in some embodiments, in a layout view, the segment WL1-2 in FIG. 3C is overlapped with the segments WL0-1 and WL1-1 in FIG. 3A, and is further overlapped with the segment WL0-2 in FIG. 3B, which is also illustrated in FIGS. 2A and 2B. The power line 323 in FIG. 3C is overlapped with the segments WL2-1 and WL3-1 in FIG. 3A, and is further overlapped with the power line 322 in FIG. 3B.

With reference to FIGS. 3A-3D, in some embodiments, in a layout view, the segment WL2-2 in FIG. 3D is overlapped with segments WL2-1 and WL3-1 in FIG. 3A, and is further overlapped with the power line 322 in FIG. 3B and the power line 323 in FIG. 3C. The power line 324 in FIG. 3D is overlapped with the segments WL0-1 and WL1-1 in FIG. 3A, and is further overlapped with the segment WL0-2 in FIG. 3B and the segment WL1-2 in FIG. 3C.

With reference to FIGS. 3A-3E, in some embodiments, in a layout view, the segment WL3-2 in FIG. 3E is overlapped with segments WL2-1 and WL3-1 in FIG. 3A, and is further overlapped with the power line 322 in FIG. 3B, the power line 323 in FIG. 3C, and the segment WL2-2 in FIG. 3D. The power line 325 in FIG. 3E is overlapped with the segments WL0-1 and WL1-1 in FIG. 3A, and is further overlapped with the segment WL0-2 in FIG. 3B, the segment WL1-2 in FIG. 3C, and the power line 324 in FIG. 3D.

In some embodiments, the segments WL0-1, WL1-1, WL2-1 and WL3-1 have sizes, including widths and lengths, that are substantially the same, as illustrated in FIG. 3A. In some other embodiments, at least one of the segments WL0-1, WL1-1, WL2-1 or WL3-1 has a size that is smaller than a size of at least one of the segments WL0-2, WL1-2, WL2-2 or WL3-2, as illustrated in FIGS. 3A-3E. In various embodiments, at least one of the segments WL0-1, WL1-1, WL2-1 or WL3-1 has a size that is greater than a size of at least one of the segments WL1-3b, WL2-3b, WL3-3b, WL2-3d, WL3-3d or WL3-3f, as illustrated in FIGS. 3A-3E. In alternative embodiments, at least one of the segments WL0-1, WL1-1, WL2-1 or WL3-1 has a size that is greater than a size of one of the power segments 321, as illustrated in FIG. 3A. The size of at least one of the segments WL0-1, WL1-1, WL2-1 or WL3-1 is further smaller than a size of at least one of the power lines 322, 323, 324 or 325, as illustrated in FIGS. 3B-3E.

In some embodiments, sizes of at least two of the segments WL0-3, WL1-3a, WL1-3b, WL1-3c, WL2-3a, WL2-3b, WL2-3c, WL2-3d, WL2-3e, WL3-3a, WL3-3b, WL3-3c, WL3-3d, WL3-3e, WL3-3f or WL3-3g are different from one another, as illustrated in FIGS. 2A-3E. These segments WL0-3, WL1-3a, WL1-3b, WL1-3c, WL2-3a, WL2-3b, WL2-3c, WL2-3d, WL2-3e, WL3-3a, WL3-3b, WL3-3c, WL3-3d, WL3-3e, WL3-3f and WL3-3g are referred to as the interconnection structures and are configured to adjust the internal resistance of the corresponding word lines WL0-WL3, for balancing the performance of the corresponding word lines WL0-WL3 in the read/write operations. With such configurations, in some embodiments, the word lines WL0-WL3 have the equivalent resistances that are substantially the same.

In some embodiments, the power segments 321 have sizes, including widths and lengths, that are substantially the same, as illustrated in FIG. 3A. In some other embodiments, at least one of the power segments 321 has a size that is smaller than a size of at least one of the power lines 322, 323, 324 or 325, as illustrated in FIGS. 3B-3E. In various embodiments, the power lines 322, 323, 324 and 325 have sizes that are substantially the same, as illustrated in FIGS. 3B-3E.

In some embodiments, a portion of each of the word lines WL0-WL3 is formed in the M1 layer. For example, with reference to FIGS. 2A-3A, the segments WL0-1, WL1-1, WL2-1 and WL3-1 of the corresponding word lines WL0-WL3 are formed in the M1 layer. Another portion of each of the word lines WL0-WL3 is formed in another metal layer above the M1 layer, and it is the highest metal layer having such portion of the corresponding word lines WL0-WL3. This highest metal layer is indicated as a top metal layer. Portions of the word lines WL0-WL3 are formed in the respective top metal layers that are different from each other, and are disposed above the M1 layer. For example, with reference to FIGS. 2A-3E, the top metal layer corresponding to the word line WL0 is referred to as the M3 layer, having the segment M0-2; the top metal layer corresponding to the word line WL1 is referred to as the M5 layer, having the segment M1-2; the top metal layer corresponding to the word line WL2 is referred to as the M7 layer, having the segment M2-2; and the top metal layer corresponding to the word line WL3 is referred to as the M9 layer, having the segment M3-2.

The configuration of the word lines WL0-WL3 shown in FIGS. 3A-3E is given for illustrative purposes. Various configurations of the word lines WL0-WL3 shown in FIGS. 3A-3E are within the contemplated scope of the present disclosure. For example, in various embodiments, with reference to FIG. 3B, the segment WL0-2 is disposed right above the bit cell 310 and overlapped with the bit cell 310.

In some approaches, word lines included in a memory device are formed in the same metal layer, and are arranged in rows sequentially. As such, widths of the word lines are restricted to the row height (i.e., the cell height), and the equivalent resistances of the word lines depend on these widths with negative correlations. Accordingly, the performance of the word lines is affected by the equivalent resistances of the word liens.

Compared to the above approaches, in the embodiments of the present disclosure, for example with reference to FIGS. 2A-3E, separated portions of each of the word lines WL0-WL3 are formed in different metal layers. The equivalent resistance of each of the word lines WL0-WL3 is reduced because the separated portions of the respective word lines WL0-WL3 are coupled in parallel. Furthermore, portions of the word lines including, for example, WL0-WL3, in the top metal layer, have a greater width than a width of the other portions thereof in the M1 layer. Accordingly, for each of the word lines WL0-WL3, the equivalent resistance is able to be adjusted or further reduced.

Figure 4A:
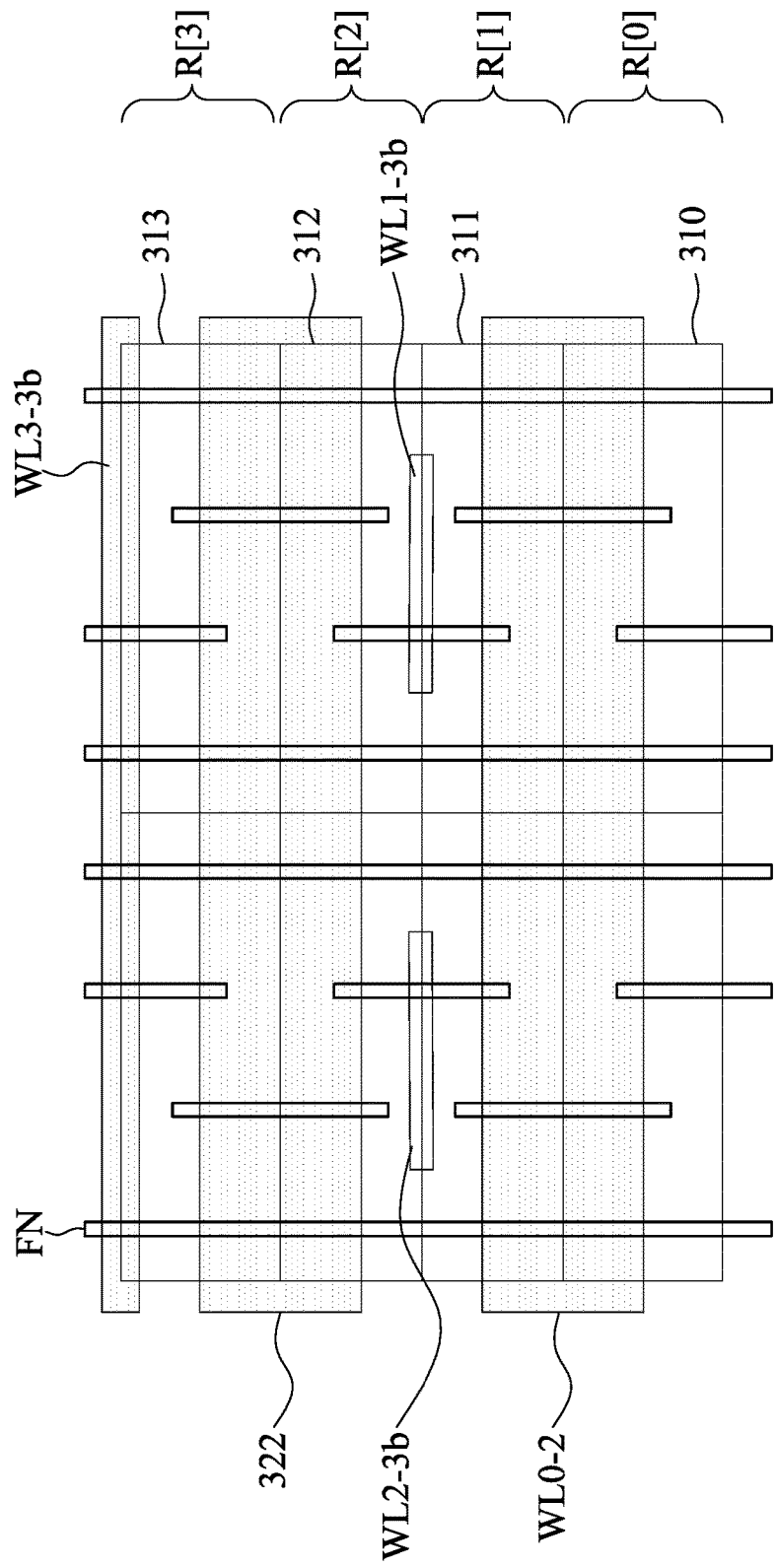
FIGS. 4A to 4C are exemplary diagrams illustrating layout diagrams of parts of a memory device corresponding to the memory device shown in FIGS. 2A and 2B, in accordance with some embodiments of the present disclosure.
Figure 4B:
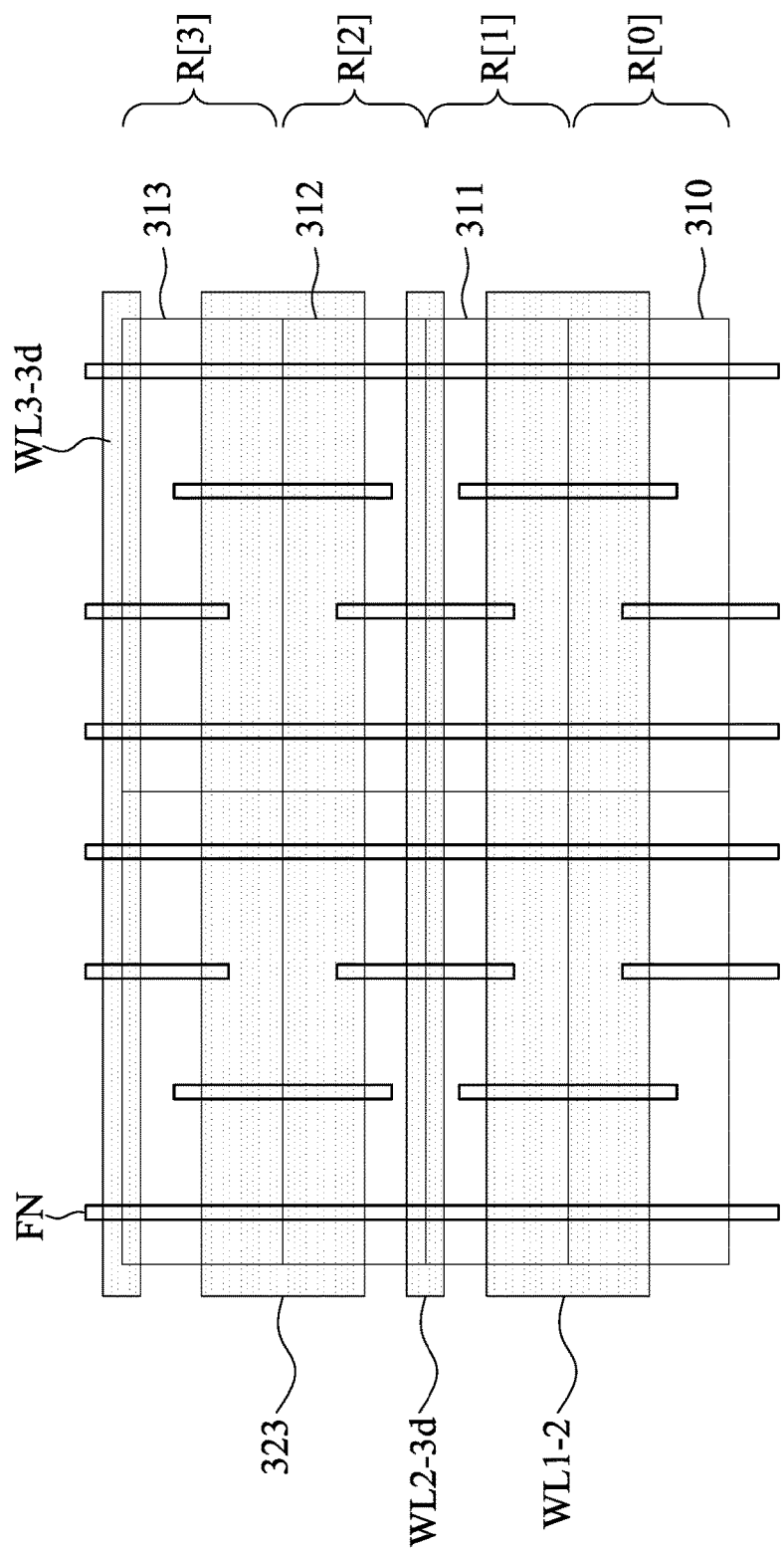
Figure 4C:
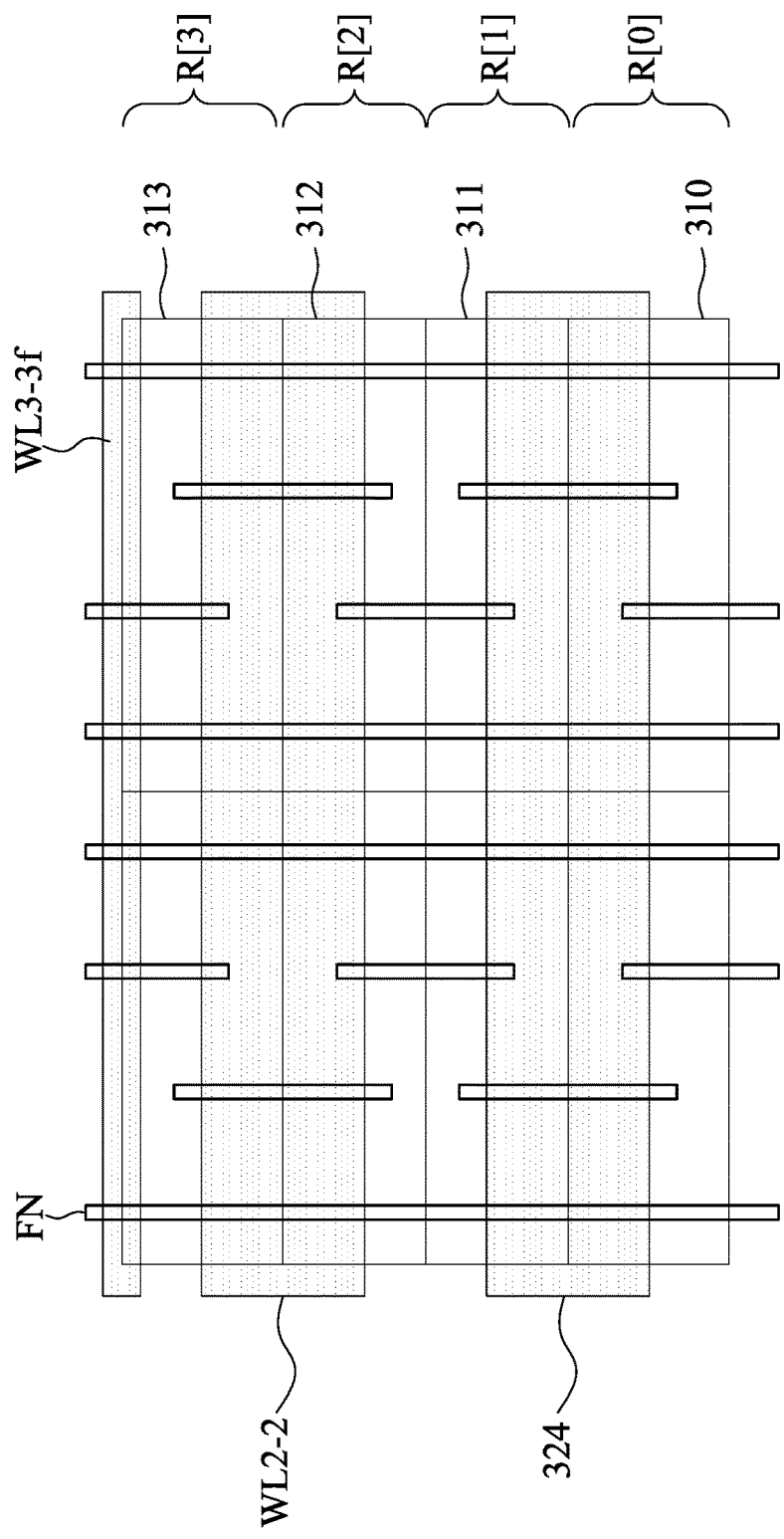

Reference is made to FIGS. 4A-4C. FIGS. 4A to 4C are exemplary diagrams illustrating layout diagrams 400A-400C of parts of a memory device corresponding to the memory device shown in FIGS. 2A and 2B, in accordance with some embodiments of the present disclosure. The embodiments shown in FIGS. 4A-4C are alternative embodiments shown in FIGS. 3B-3D, in accordance with some embodiments of the present disclosure. With respect to the embodiments of FIGS. 3B-3D, like elements in FIGS. 4A-4C are designated with the same reference numbers for ease of understanding. For ease of understanding, the embodiments with respect to FIG. 4A are discussed with reference to FIGS. 3B-3D and 4B-4C, and only illustrates elements that are associated with the word lines WL0-WL3.

As illustrated in FIG. 4A, a layout diagram 400A illustrates a plan view, viewing a part of the memory device formed in the M3 layer. The bit cells 310, 311, 312 and 313, the fins FN, the segments WL0-2, WL1-3*b*, WL2-3*b* and WL3-3*b*, and the power line 322 have configurations that are similar to the same as discussed with reference to FIG. 3B. As such, similar configurations are not further detailed herein.

Compared to FIG. 3B, in the layout diagram 400A shown in FIG. 4A, the segment WL3-3*b* extends in the row direction, and has a length that is greater than a length of the segment WL3-3*b* in FIG. 3B. A length of the segment WL3-3*b* in FIG. 4A is further greater than a length of the segment WL1-3*b* or WL2-3*b*.

As illustrated in FIG. 4B, a layout diagram 400B illustrates a plan view, viewing a part of the memory device formed in the M5 layer. The segments WL1-2, WL2-3*d* and WL3-3*d*, and the power line 323 have configurations that are similar to the same as discussed with reference to FIG. 3C. As such, similar configurations are not further detailed herein.

Compared to FIG. 3C, in the layout diagram 400B shown in FIG. 4B, the segment WL2-3*d* extends in the row direction, and has a length that is greater than a length of the segment WL2-3*d* in FIG. 3C. In addition, the segment WL3-3*d* extends in the row direction, and has a length that is greater than a length of the segment WL3-3*d* in FIG. 3C. The segments WL2-3*d* and WL3-3*d* have sizes, including lengths and widths, that are substantially the same.

As illustrated in FIG. 4C, a layout diagram 400C illustrates a plan view, viewing a part of the memory device formed in the M7 layer. The segments WL2-2 and WL3-3*f*, and the power line 324 have configurations that are similar to the same as discussed with reference to FIG. 3D. As such, similar configurations are not further detailed herein.

Compared to FIG. 3D, in the layout diagram 400C shown in FIG. 4C, the segment WL3-3*f* extends in the row direction, and has a length that is greater than a length of the segment WL3-3*f* in FIG. 3D.

In some embodiments, the segments WL3-3*b*, WL2-3*d*, WL3-3*d* and WL3-3*f* have sizes that are substantially the same, as illustrated in FIGS. 4A-4C. In some other embodiments, a length of at least one of the segments WL3-3*b*, WL2-3*d*, WL3-3*d* or WL3-3*f* in FIGS. 4A-4C is smaller than a length of the segments WL0-2, WL1-2 or WL2-2 in FIGS. 4A-4C.

Figure 5:
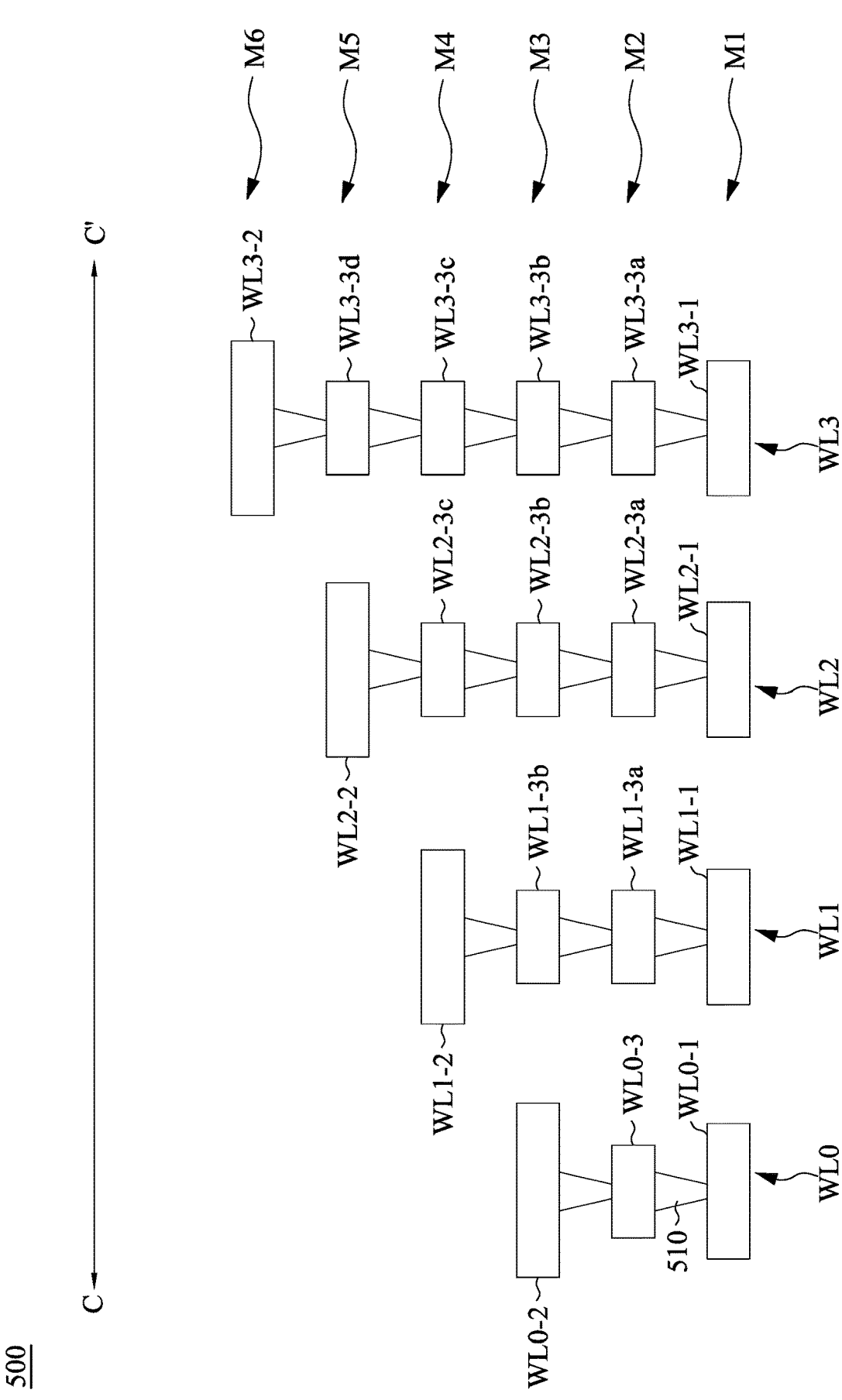
FIG. 5 is a cross-section schematic diagram of a part of a memory device corresponding to the memory device shown in FIG. 1, in accordance with some embodiments of the present disclosure.

Reference is made to FIG. 5. FIG. 5 is a cross-section schematic diagram of a part of a memory device 500 corresponding to the memory device 100 shown in FIG. 1, in accordance with some embodiments of the present disclosure. FIG. 5 illustrates a cross-section view along a cross line C-C' of one part of the memory device 500 including the word lines WL0-WL3. The embodiments shown in FIG. 5 are alternative embodiments shown in FIGS. 2A-2B, in accordance with some embodiments of the present disclosure. With respect to the embodiments of FIGS. 2A-2B, like elements in FIG. 5 are designated with the same reference numbers for ease of understanding.

As illustrated in FIG. 5, the word lines WL0-WL3 and the vias 510 are arranged in the M1-M6 layers. For simplicity of illustration, only one via 510 is labeled in FIG. 5.

The segments WL0-1, WL0-3 and WL0-2 of the word line WL0 are formed in the M1, M2 and M3 layers, respectively. The segments WL0-1, WL0-2 and WL0-3 are coupled together through the vias 510. In some embodiments, the segment WL0-1 is referred to as the base segment, and the segment WL0-2 is referred to as the roof segment. The base segment and the roof segment are two main structures for transmitting the word line signal to the corresponding bit cells including, for example, the bit cells BC arranged in the row R[0] shown in FIG. 1.

The segments WL1-1, WL1-3*a*, WL1-3*b* and WL1-2 of the word line WL1 are formed in the M1, M2, M3 and M4 layers, respectively. The segments WL1-1, WL1-3*a*, WL1-3*b* and WL1-2 are coupled together through the vias 510. In some embodiments, the segments WL1-1 and WL1-2 are two main structures for transmitting the word line signal to the corresponding bit cells including, for example, the bit cells BC arranged in the row R[1] shown in FIG. 1.

The segments WL2-1, WL2-3*a*, WL2-3*b*, WL2-3*c* and WL2-2 of the word line WL2 are formed in the M1, M2, M3, M4 and M5 layers, respectively. The segments WL2-1, WL2-3*a*, WL2-3*b*, WL2-3*c* and WL2-2 are coupled together through the vias 510. In some embodiments, the segments WL2-1 and WL2-2 are two main structures for transmitting the word line signal to the corresponding bit cells including, for example, the bit cells BC arranged in the row R[2] shown in FIG. 1.

The segments WL3-1, WL3-3a, WL3-3b, WL3-3c, WL3-3d and WL3-2 of the word line WL3 are formed in the M1, M2, M3, M4, M5 and M6 layers, respectively. The segments WL3-1, WL3-3a, WL3-3b, WL3-3c, WL3-3d and WL3-2 are coupled together through the vias 510. In some embodiments, the segments WL3-1 and WL3-2 are two main structures for transmitting the word line signal to the corresponding bit cells including, for example, the bit cells BC arranged in the row R[3] shown in FIG. 1.

Figure 6:
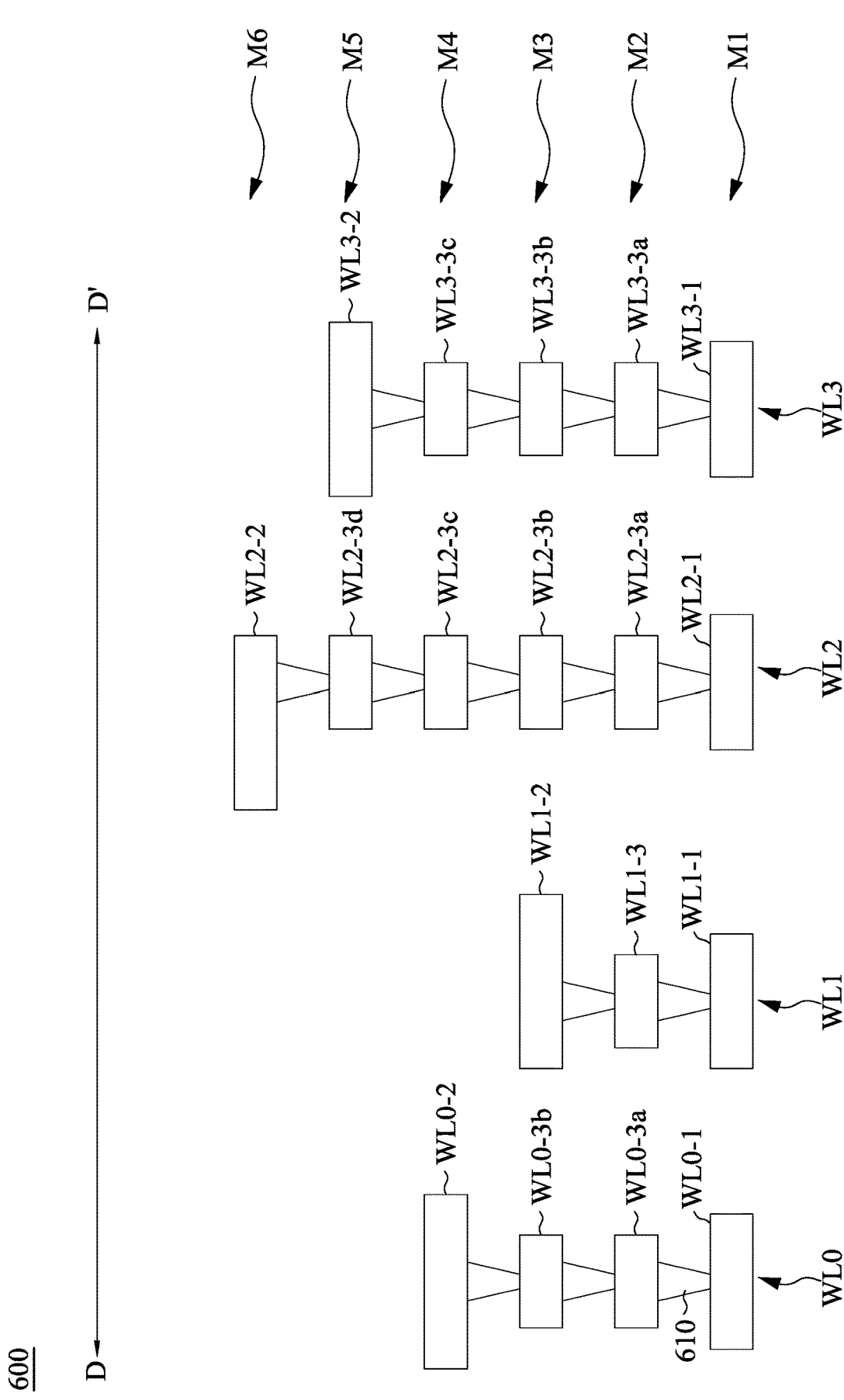
FIG. 6 is a cross-section schematic diagram of a part of a memory device corresponding to the memory device shown in FIG. 1, in accordance with some embodiments of the present disclosure.

Reference is made to FIG. 6. FIG. 6 is a cross-section schematic diagram of a part of a memory device 600 corresponding to the memory device 100 shown in FIG. 1, in accordance with some embodiments of the present disclosure. FIG. 6 illustrates a cross-section view along a cross line D-D' of one part of the memory device 600 including the word lines WL0-WL3. The embodiments shown in FIG. 6 are alternative embodiments shown in FIG. 5, in accordance with some embodiments of the present disclosure. With respect to the embodiments of FIG. 5, like elements in FIG. 6 are designated with the same reference numbers for ease of understanding.

Compared to embodiments shown in FIG. 5, the segment WL0-2 of the word line WL0 is formed in the M4 layer. The word line WL0 further has the segments WL0-3a and WL0-3b formed in the M2 and M3 layers, respectively. The segments WL0-3a and WL0-3b are referred to as the interconnection structures for coupling two main structures together. These two main structures in the word line WL0 are the segments WL0-1 and WL0-2, for transmitting the word line data.

In addition, compared to embodiments shown in FIG. 5, the segment WL1-2 of the word line WL1 is formed in the M3 layer, and the segment WL1-3 is formed in the M2 layer. The segment WL2-2 of the word line WL2 is formed in the M6 layer, and the segments WL2-3a, WL2-3b, WL2-3c and WL2-3d are formed in the continuous M2-M5 layers. The segment WL3-2 of the word line WL3 is formed in the M5 layer, and the segments WL3-3a, WL3-3b and WL3-3c are formed in the continuous M2-M4 layers.

In some embodiments, X word lines are considered as a group, for transmitting X word line signals to bit cells arranged in X rows. These X word lines are formed in continuous metal layers including a first metal (M1) layer to an (X+1)-th metal layer. The top metal layer corresponding to the N-th word line of this group is (2×N+3)-th metal layer. The N is zero or positive integer, and is not greater than the X. In various embodiments, the X is a positive integer and is more than 4. For example, as illustrated in FIGS. 2A-3E, X is 4, and the group includes four word lines WL0-WL3, and the N is 0, 1, 2 or 3. If the N is 0, the top metal layer of the 0-th word line, which is the word line WL0 is (2×0+3)-th metal layer, which is M3 layer. Similarly, if the N is 1, the top metal layer of the word line WL1 is (2×1+3)-th metal layer, which is M5 layer. If the N is 2, the top metal layer of the word line WL2 is (2×2+3)-th metal layer, which is M7 layer. If the N is 3, the top metal layer of the word line WL3 is (2×3+3)-th metal layer, which is M9 layer.

In some embodiments, the top metal layer corresponding to the N-th word line of this group is (N+3)-th metal layer. The N is zero or positive integer, and is not greater than the X. For example, as illustrated in FIG. 5, X is 4, and the N is 0, 1, 2 or 3. If the N is 0, the top metal layer of the WL0 is (0+3)-th metal layer, which is M3 layer; if the N is 1, the top metal layer of the WL1 is (1+3)-th metal layer, which is M4 layer; if the N is 2, the top metal layer of the WL2 is (2+3)-th metal layer, which is M5 layer; and if the N is 3, the top metal layer of the WL3 is (3+3)-th metal layer, which is M6 layer.

In some embodiments, the top metal layer corresponding to the N-th word line of this group is ((N+1)+3)-th metal layer if the N is an even number, and the top metal layer corresponding to the N-th word line of this group is ((N−1)+3)-th metal layer if the N is an odd number. For example, as illustrated in FIG. 6, X is 4, and the N is 0, 1, 2 or 3. If the N is 0, the top metal layer of the WL0 is ((0+1)+3)-th metal layer, which is M4 layer; if the N is 1, the top metal layer of the WL1 is ((1−1)+3)-th metal layer, which is M3 layer; if the N is 2, the top metal layer of the WL2 is ((2+1)+3)-th metal layer, which is M6 layer; and if the N is 3, the top metal layer of the WL3 is ((3−1)+3)-th metal layer, which is M5 layer.

Figure 7:
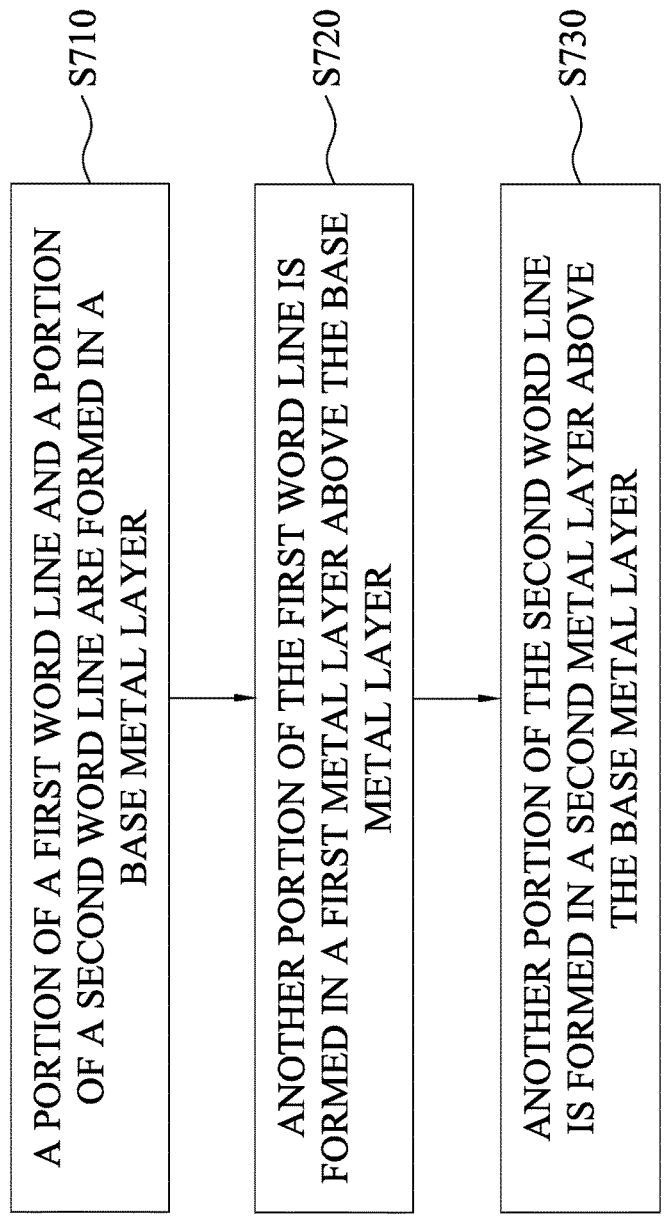
FIG. 7 is a flow chart of a method for generating a memory device, in accordance with some embodiments of the present disclosure.

Reference is made to FIG. 7. FIG. 7 is a flow chart of a method 700 for generating a memory device corresponding to the memory device 100 shown in FIG. 1 or the memory device 200 shown in FIGS. 2A and 2B, in accordance with some embodiments of the present disclosure. Following illustrations of the method 700 in FIG. 7 with reference to the memory device 200 shown in FIGS. 2A and 2B include exemplary operations. However, the operations in FIG. 7 are not necessarily performed in the order shown. Alternatively stated, operations may be added, replaced, changed order, and/or eliminated as appropriate, in accordance with the spirit and scope of various embodiments of the present disclosure.

In operation S710, a portion of a first word line and a portion of a second word line are formed in a base metal layer. For illustration, in some embodiments, as shown in FIGS. 2A and 2B, the segment WL0-1 of the word line WL0 and the segment WL1-1 of the word line WL1 are formed in the M1 layer.

In operation S720, another portion of the first word line is formed in a first metal layer above the base metal layer. For illustration, in some embodiments, as shown in FIGS. 2A and 2B, the segment WL0-2 of the word line WL0 is formed in the M3 layer which is above the M1 layer. In some other embodiments, as shown in FIG. 5, the segment WL0-2 of the word line WL1 is formed in the M3 layer which is above the M1 layer. In alternative embodiments, as shown in FIG. 6, the segment WL0-2 of the word line WL0 is formed in the M4 layer which is above the M1 layer.

In operation S730, another portion of the second word line is formed in a second metal layer above the base metal layer. For illustration, in some embodiments, as shown in FIGS. 2A and 2B, the segment WL1-2 of the word line WL1 is formed in the M5 layer which is above the M1 layer. In some other embodiments, as shown in FIG. 5, the segment WL1-2 of the word line WL1 is formed in the M4 layer which is above the M1 layer. In alternative embodiments, as shown in FIG. 6, the segment WL1-2 of the word line WL1 is formed in the M3 layer which is above the M1 layer.

In some embodiments, the method 700 further includes the following operations. The other portion of the first word line is formed in a third metal layer between the base metal layer and the first metal layer. For illustration, in some embodiments, as shown in FIGS. 2A and 2B, the segment WL0-3 of the word line WL0 is formed in the M2 layer which is disposes between the M1 and M3 layers. Furthermore, the other portions of the second word line are formed in fourth continuous metal layers between the base metal layer and the second metal layer. For illustration, in some embodiments, as shown in FIGS. 2A and 2B, the segments WL1-3a, WL1-3b and WL1-3c of the word line WL1 are formed in the M2-M4 layers which are disposes between the M1 and M5 layers.

Figure 8:
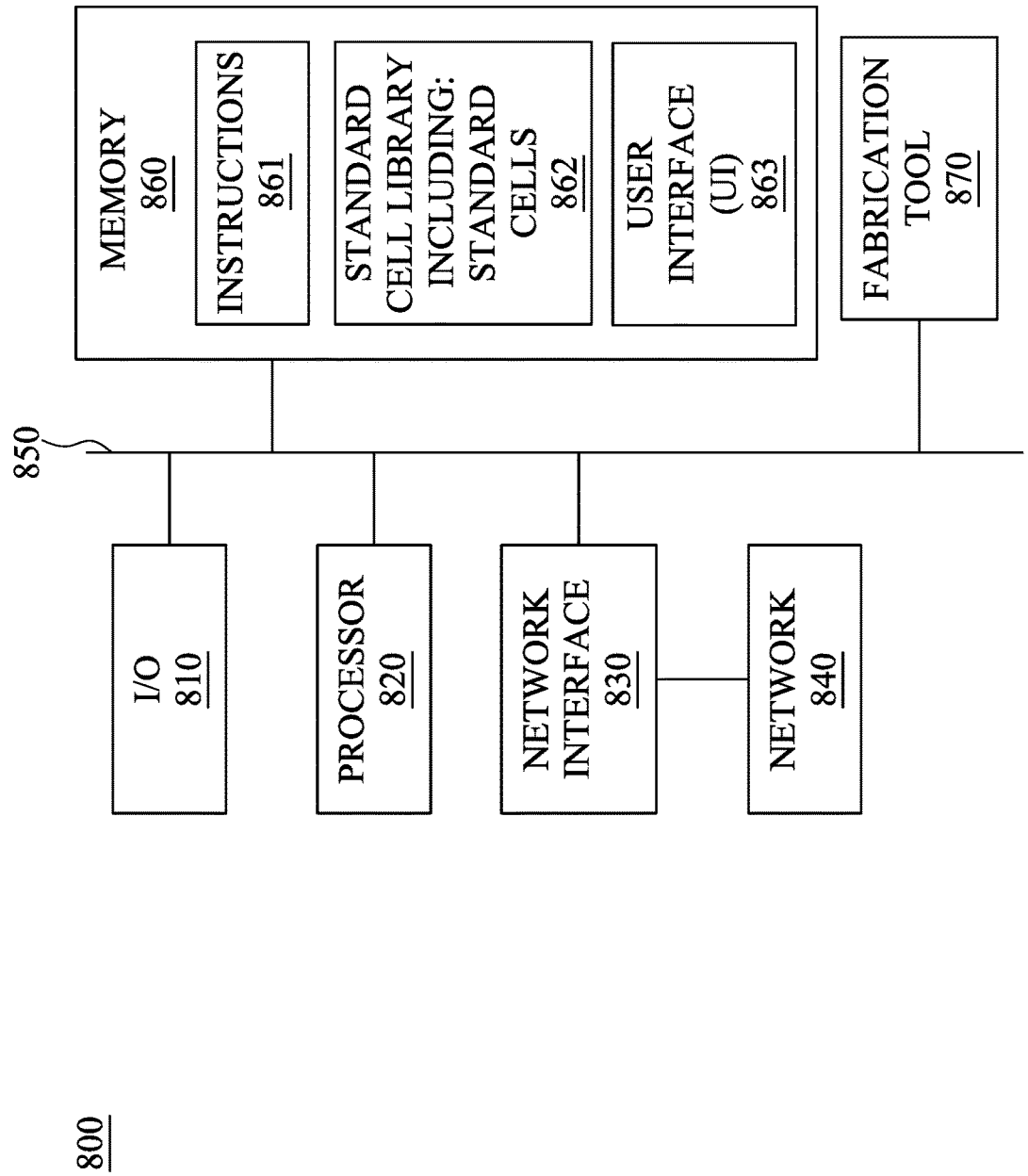
FIG. 8 is a block diagram of a system for designing an IC layout design, in accordance with some embodiments of the present disclosure.

Reference is now made to FIG. 8. FIG. 8 is a block diagram of an electronic design automation (EDA) system 800 for designing the integrated circuit layout design, in accordance with some embodiments of the present disclosure. EDA system 800 is configured to implement one or more operations of the method 700 disclosed in FIG. 7, and further explained in conjunction with FIGS. 2A-6. In some embodiments, EDA system 800 includes an APR system.

In some embodiments, EDA system 800 is a general purpose computing device including a hardware processor 820 and a non-transitory, computer-readable storage medium 860. Storage medium 860, amongst other things, is encoded with, i.e., stores, computer program code (instructions) 861, i.e., a set of executable instructions. Execution of instructions 861 by hardware processor 820 represents (at least in part) an EDA tool which implements a portion or all of, e.g., the method 700.

The processor 820 is electrically coupled to computer-readable storage medium 860 via a bus 850. The processor 820 is also electrically coupled to an I/O interface 810 and a fabrication tool 870 by bus 850. A network interface 830 is also electrically connected to processor 820 via bus 850. Network interface 830 is connected to a network 840, so that processor 820 and computer-readable storage medium 860 are capable of connecting to external elements via network 840. The processor 820 is configured to execute computer program code 861 encoded in computer-readable storage medium 860 in order to cause EDA system 800 to be usable for performing a portion or all of the noted processes and/or methods. In one or more embodiments, processor 820 is a central processing unit (CPU), a multi-processor, a distributed processing system, an application specific integrated circuit (ASIC), and/or a suitable processing unit.

In one or more embodiments, computer-readable storage medium 860 is an electronic, magnetic, optical, electromagnetic, infrared, and/or a semiconductor system (or apparatus or device). For example, computer-readable storage medium 860 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 860 includes a compact disk-read only memory (CD-ROM), a compact disk-read/write (CD-R/W), and/or a digital video disc (DVD).

In one or more embodiments, storage medium 860 stores computer program code 861 configured to cause EDA system 800 (where such execution represents (at least in part) the EDA tool) to be usable for performing a portion or all of the noted processes and/or methods. In one or more embodiments, storage medium 860 also stores information which facilitates performing a portion or all of the noted processes and/or methods. In one or more embodiments, storage medium 860 stores library 862 of standard cells including such standard cells as disclosed herein, for example, a cell including word lines WL discussed above with respect to FIG. 1.

EDA system 800 includes I/O interface 810. I/O interface 810 is coupled to external circuitry. In one or more embodiments, I/O interface 810 includes a keyboard, keypad, mouse, trackball, trackpad, touchscreen, and/or cursor direction keys for communicating information and commands to processor 820.

EDA system 800 also includes network interface 830 coupled to processor 820. Network interface 830 allows EDA system 800 to communicate with network 840, to which one or more other computer systems are connected. Network interface 830 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 800.

EDA system 800 also includes the fabrication tool 870 coupled to the processor 820. The fabrication tool 870 is configured to fabricate integrated circuits, including, for example, the memory device 100 illustrated in FIG. 1, based on the design files processed by the processor 820 and/or the IC layout designs as discussed above.

EDA system 800 is configured to receive information through I/O interface 810. The information received through I/O interface 810 includes one or more of instructions, data, design rules, libraries of standard cells, and/or other parameters for processing by processor 820. The information is transferred to processor 820 via bus 850. EDA system 800 is configured to receive information related to a UI through I/O interface 810. The information is stored in computer-readable medium 860 as user interface (UI) 863.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 800. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 9:
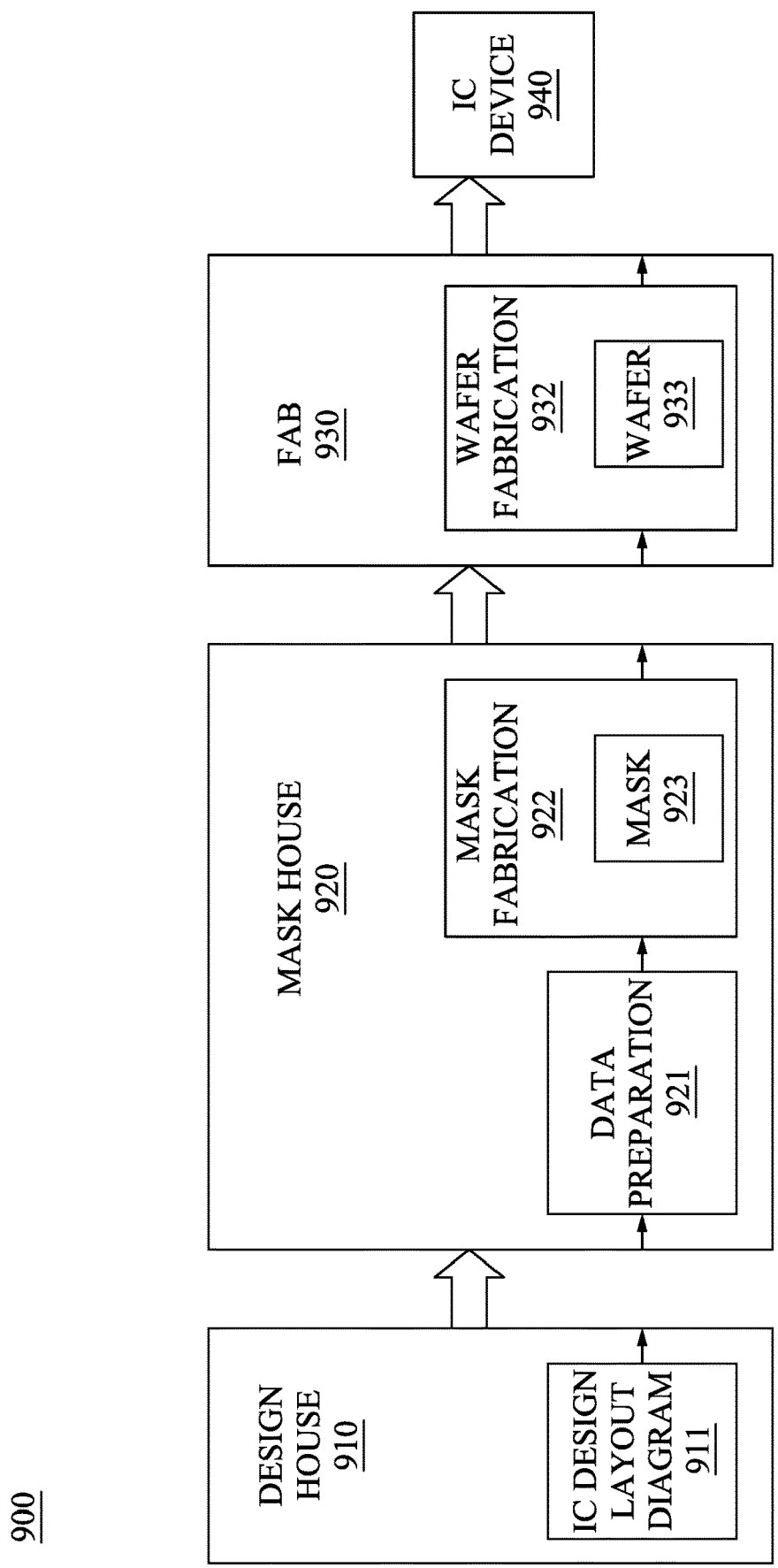
FIG. 9 is a block diagram of an IC manufacturing system, and an IC manufacturing flow associated therewith, in accordance with some embodiments of the present disclosure.

FIG. 9 is a block diagram of IC manufacturing system 900, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 900.

In FIG. 9, IC manufacturing system 900 includes entities, such as a design house 910, a mask house 920, and an IC manufacturer/fabricator ("fab") 930, that interact with one another in the design, development, and manufacturing cycles and/or services related to manufacturing an IC device 940. The entities in IC manufacturing system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 910, mask house 920, and IC fab 930 is owned by a single larger company. In some embodiments, two or more of design house 910, mask house 920, and IC fab 930 coexist in a common facility and use common resources.

Design house (or design team) 910 generates an IC design layout diagram 911. IC design layout diagram 911 includes various geometrical patterns, for example, an IC layout design depicted in FIG. 3A-3E and/or FIG. 4A-4C, designed for an IC device 940, for example, integrated circuits including the memory device 200, 500 and 600, discussed above with respect to FIG. 3A, FIGS. 2A-2B, FIG. 5, and/or FIG. 6. The geometrical patterns correspond to patterns of metal, oxide, or semiconductor layers that make up the various components of IC device 940 to be fabricated. The various layers combine to form various IC features. For example, a portion of IC design layout diagram 911 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 910 implements a proper design procedure to form IC design layout diagram 911. The design procedure includes one or more of logic design, physical design or place and route. IC design layout diagram 911 is presented in one or more data files having information of the geometrical patterns. For example, IC design layout diagram 911 can be expressed in a GDSII file format or DFII file format.

Mask house 920 includes mask data preparation 921 and mask fabrication 922. Mask house 920 uses IC design layout diagram 911 to manufacture one or more masks 923 to be used for fabricating the various layers of IC device 940 according to IC design layout diagram 911. Mask house 920 performs mask data preparation 921, where IC design layout diagram 911 is translated into a representative data file ("RDF"). Mask data preparation 921 provides the RDF to mask fabrication 922. Mask fabrication 922 includes a mask writer. A mask writer converts the RDF to an image on a substrate, such as a mask (reticle) 923 or a semiconductor wafer 933. The IC design layout diagram 911 is manipulated by mask data preparation 921 to comply with particular characteristics of the mask writer and/or requirements of IC fab 930. In FIG. 9, data preparation 921 and mask fabrication 922 are illustrated as separate elements. In some embodiments, data preparation 921 and mask fabrication 922 can be collectively referred to as mask data preparation.

In some embodiments, data preparation 921 includes optical proximity correction (OPC) which uses lithography enhancement techniques to compensate for image errors, such as those that can arise from diffraction, interference, other process effects and the like. OPC adjusts IC design layout diagram 911. In some embodiments, data preparation 921 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 921 includes a mask rule checker (MRC) that checks the IC design layout diagram 911 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 911 to compensate for limitations during mask fabrication 922, which may undo part of the modifications performed by OPC in order to meet mask creation rules.

In some embodiments, data preparation 921 includes lithography process checking (LPC) that simulates processing that will be implemented by IC fab 930 to fabricate IC device 940. LPC simulates this processing based on IC design layout diagram 911 to create a simulated manufactured device, such as IC device 940. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 911.

It should be understood that the above description of data preparation 921 has been simplified for the purposes of clarity. In some embodiments, data preparation 921 includes additional features such as a logic operation (LOP) to modify the IC design layout diagram 911 according to manufacturing rules. Additionally, the processes applied to IC design layout diagram 911 during data preparation 921 may be executed in a variety of different orders.

After data preparation 921 and during mask fabrication 922, a mask 923 or a group of masks 923 are fabricated based on the modified IC design layout diagram 911. In some embodiments, mask fabrication 922 includes performing one or more lithographic exposures based on IC design layout diagram 911. In some embodiments, an electron-beam (e-beam) or a mechanism of multiple e-beams is used to form a pattern on a mask (photomask or reticle) 923 based on the modified IC design layout diagram 911. Mask 923 can be formed in various technologies. In some embodiments, mask 923 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 923 includes a transparent substrate (for example, fused quartz) and an opaque material (for example, chromium) coated in the opaque regions of the binary mask. In another example, mask 923 is formed using a phase shift technology. In a phase shift mask (PSM) version of mask 923, various features in the pattern formed on the phase shift mask are configured to have proper phase difference to enhance the resolution and imaging quality. In various examples, the phase shift mask can be attenuated PSM or alternating PSM. The mask(s) generated by mask fabrication 922 is used in a variety of processes. For example, such a mask(s) is used in an ion implantation process to form various doped regions in semiconductor wafer 933, in an etching process to form various etching regions in semiconductor wafer 933, and/or in other suitable processes.

IC fab 930 includes wafer fabrication 932. IC fab 930 is an IC fabrication business that includes one or more manufacturing facilities for the fabrication of a variety of different IC products. In some embodiments, IC Fab 930 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 930 uses mask(s) 923 fabricated by mask house 920 to fabricate IC device 940. Thus, IC fab 930 at least indirectly uses IC design layout diagram 911 to fabricate IC device 940. In some embodiments, semiconductor wafer 933 is fabricated by IC fab 930 using mask(s) 923 to form IC device 940. In some embodiments, the IC fabrication includes performing one or more lithographic exposures based at least indirectly on IC design layout diagram 911. Semiconductor wafer 933 includes a silicon substrate or other proper substrate having material layers formed thereon. Semiconductor wafer 933 further includes one or more of various doped regions, dielectric features, multi-level interconnects, and the like (formed at subsequent manufacturing steps).

In some embodiments, a memory device is disclosed. The memory device includes a first program line and a second program line. The first program line is configured to transmit a first program signal to memory cells arranged in a first row. A first portion of the first program line is formed in a first conductive layer, and a second portion of the first program line is formed in a second conductive layer above the first conductive layer. The second program line is configured to transmit a second program signal to memory cells arranged in a second row. A first portion of the second program line is formed in the first conductive layer, and a second portion of the second program line is formed in a third conductive layer above the second conductive layer. A width of at least one of the second portion of the first program line or the second portion of the second program line is different from a width of at least one of the first portion of the first program line or the first portion of the second program line.

In some embodiments, a width of the first portion of the first program line is smaller than a width of the second portion of the first program line. A width of the first portion of the second program line is smaller than a width of the second portion of the second program line. The first program line and the second program line have equivalent resistances that are substantially the same.

In some embodiments, the memory device further includes a third program line. The third program line is configured to transmit a third program signal to memory cells arranged in a third row. A first portion of the third program line is formed in the first conductive layer, and a second portion of the third program line is formed in a fourth conductive layer above the third conductive layer. A width of the second portion of the third program line is greater than a width of at least one of the first portion of the first program line, the first portion of the second program line, the first portion of the third program line, the second portion of the first program line, the second portion of the second program line or the second portion of the third program line.

In some embodiments, a third portion of the first program line is formed in a fourth conductive layer between the first conductive layer and the second conductive layer. Third portions of the second program line formed in continuous conductive layers between the first conductive layer and the third conductive layer.

In some embodiments, a size of at least one of the third portions of the second program line is smaller than a size of at least one of the first portion of the first program line or the first portion of the second program line.

In some embodiments, the memory device further includes at least one power line. The at least one power line is formed in the second conductive layer and configured to receive a power voltage signal. In a layout view, the at least one power line, the second portion of the first program line, and one of the third portions of the second program line in the second conductive layer are separated from each other.

In some embodiments, the memory device further includes at least one power segment. The at least one power segment is formed in the first conductive layer and configured to receive a power voltage signal. In a layout view, the at least one power segment is disposed between the first portion of the first program line and the first portion of the second program line.

Also disclosed is a memory device which includes an N-th program line, an (N+1)-th program line, an (N+2)-th program line, and an (N+3)-th program line. The N-th program line is configured to transmit an N-th program signal to memory cells arranged in an N-th row. A first portion of the N-th program line is formed in a 1st conductive layer, and a second portion of the N-th program line is formed in an X1-th conductive layer above the 1st conductive layer. The (N+1)-th program line is configured to transmit an (N+1)-th program signal to memory cells arranged in an (N+1)-th row. A first portion of the (N+1)-th program line is formed in the 1st conductive layer, and a second portion of the (N+1)-th program line is formed in an X2-th conductive layer above the 1st conductive layer. The (N+2)-th program line is configured to transmit an (N+2)-th program signal to memory cells arranged in an (N+2)-th row. A first portion of the (N+2)-th program line is formed in the 1st conductive layer, and a second portion of the (N+2)-th program line is formed in an X3-th conductive layer above the 1st conductive layer. The (N+3)-th program line is configured to transmit an (N+3)-th program signal to memory cells arranged in an (N+3)-th row. A first portion of the (N+3)-th program line is formed in the 1st conductive layer, and a second portion of the (N+3)-th program line is formed in an X4-th conductive layer above the 1st conductive layer. N, X1, X2, X3 and X4 are positive integers, and X1, X2, X3 and X4 are different from one another.

In some embodiments, a width of the first portion of the N-th program line is substantially equal to a width of at least one of the first portion of the (N+1)-th program line, the first portion of the (N+2)-th program line, or the first portion of the (N+3)-th program line. A width of the first portion of the N-th program line is different from a width of at least one of the second portion of the N-th program line, the second portion of the (N+1)-th program line, the second portion of the (N+2)-th program line, or the second portion of the (N+3)-th program line.

In some embodiments, a third portion of the N-th program line is formed in a 2nd conductive layer between the 1st conductive layer and the X1-th conductive layer. Third portions of the (N+1)-th program line are formed in continuous conductive layers between the 1st conductive layer and the X2-th conductive layer. The N-th program line and the (N+1)-th program line have equivalent resistances that are substantially the same.

In some embodiments, the memory device further includes at least one power line. The at least one power line is formed in the X1-th conductive layer. In a layout view, one of the third portions of the (N+1)-th program line in the X1-th conductive layer is disposed between the at least one power line and the second portion of the N-th program line.

In some embodiments, the memory device further includes a plurality of power segments. The plurality of power segments are formed in the 1st conductive layer. In a layout view, the plurality of power segments are disposed between at least two of the first portion of the N-th program line, the first portion of the (N+1)-th program line, the first portion of the (N+2)-th program line, or the first portion of the (N+3)-th program line. The plurality of power segments and the at least one power line are configured to receive a power signal, and have sizes that are different from each other.

In some embodiments, third portions of the (N+2)-th program line are formed in a plurality of first continuous conductive layers between the 1st conductive layer and the X3-th conductive layer. Fourth portions of the (N+3)-th program line are formed in a plurality of second continuous conductive layers between the 1st conductive layer and the X4-th conductive layer. An amount of the third portions of the (N+2)-th program line is less than an amount of the fourth portions of the (N+3)-th program line.

In some embodiments, the plurality of first continuous conductive layers and the plurality of second continuous conductive layers comprise the X1-th conductive layer. In the X1-th conductive layer, one of the third portions of the (N+2)-th program line, one of the fourth portions of the (N+3)-th program line and the second portion of the N-th program line are separated from each other, in a layout view. A size of one of the third portions of the (N+2)-th program line or one of the fourth portions of the (N+3)-th program line is smaller than a size of the second portion of the N-th program line.

In some embodiments, a length of one of the third portions of the (N+2)-th program line is different from a length of one of the fourth portions of the (N+3)-th program line.

In some embodiments, X1 is equal to $(2\times(N-1)+3)$, X2 is equal to $(2\times(N)+3)$, X3 is equal to $(2\times(N+1)+3)$, and X4 is equal to $(2\times(N+2)+3)$. The X1 is an integer more than 1.

In some embodiments, X1 is equal to $((N-1)+3)$, X2 is equal to $(N+3)$, X3 is equal to $((N+1)+3)$, and X4 is equal to $((N+2)+3)$. The X1 is an integer more than 1.

Also disclosed is a method which includes the following operations. A first portion of a first program line and a first portion of a second program line are formed in a first conductive layer. A second portion of the first program line is formed in a second conductive layer above the first conductive layer. A second portion of the second program line is formed in a third conductive layer above the first conductive layer. A width of the first portion of the first program line is different from a width of the second portion of the first program line, and a width of the first portion of the second program line is different from a width of the second portion of the second program line.

In some embodiments, the method further includes the following operations. A first portion of a third program line and a first portion of a fourth program line are in the first conductive layer. A second portion of the third program line is formed in a fourth conductive layer above the first conductive layer. A second portion of the fourth program line is formed in a fifth conductive layer above the third conductive layer. A width of the first portion of the third program line is smaller than a width of the second portion of the third program line. A width of the first portion of the fourth program line is smaller than a width of the second portion of the fourth program line. The third program line and the fourth program line have equivalent resistances that are substantially the same.

In some embodiments, the method further includes the following operations. A third portion of the first program line is formed in a fourth conductive layer between the first conductive layer and the second conductive layer. Third portions of the second program line are formed in continuous conductive layers between the first conductive layer and the third conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a first program line configured to transmit a first program signal to memory cells arranged in a first row, wherein a first portion of the first program line is formed in a first conductive layer, and a second portion of the first program line is formed in a second conductive layer above the first conductive layer; and
    a second program line configured to transmit a second program signal to memory cells arranged in a second row, wherein a first portion of the second program line is formed in the first conductive layer, and a second portion of the second program line is formed in a third conductive layer above the second conductive layer,
    wherein a width of at least one of the second portion of the first program line or the second portion of the second program line is different from a width of at least one of the first portion of the first program line or the first portion of the second program line,
    a third portion of the second program line is disposed in the second conductive layer and is separated from the second portion of the first program line, and
    the second portion of the first program line is overlapped with each of the first portion of the first program line and the first portion of the second program line in a layout view.

2. The memory device of claim 1, wherein
    a width of the first portion of the first program line is smaller than a width of the second portion of the first program line,
    a width of the first portion of the second program line is smaller than a width of the second portion of the second program line, and
    the first program line and the second program line have equivalent resistances that are substantially the same.

3. The memory device of claim 1, further comprising:
    a third program line configured to transmit a third program signal to memory cells arranged in a third row, wherein a first portion of the third program line is formed in the first conductive layer, and a second portion of the third program line is formed in a fourth conductive layer above the third conductive layer,
wherein a width of the second portion of the third program line is greater than a width of at least one of the first portion of the first program line, the first portion of the second program line, the first portion of the third program line, the second portion of the first program line, the second portion of the second program line or the second portion of the third program line.

4. The memory device of claim 1, wherein
a third portion of the first program line is formed in a fourth conductive layer between the first conductive layer and the second conductive layer, and
third portions of the second program line formed in continuous conductive layers between the first conductive layer and the third conductive layer.

5. The memory device of claim 4, wherein a size of at least one of the third portions of the second program line is smaller than a size of at least one of the first portion of the first program line or the first portion of the second program line.

6. The memory device of claim 4, further comprising:
at least one power line formed in the second conductive layer and configured to receive a power voltage signal,
wherein in the layout view, the at least one power line, the second portion of the first program line, and one of the third portions of the second program line in the second conductive layer are separated from each other.

7. The memory device of claim 1, further comprising:
at least one power segment formed in the first conductive layer and configured to receive a power voltage signal,
wherein in the layout view, the at least one power segment is disposed between the first portion of the first program line and the first portion of the second program line.

8. A method, comprising:
forming a first portion of a first program line and a first portion of a second program line in a first conductive layer;
forming a second portion of the first program line in a second conductive layer above the first conductive layer; and
forming a second portion of the second program line in a third conductive layer above the first conductive layer,
wherein a width of the first portion of the first program line is different from a width of the second portion of the first program line, and a width of the first portion of the second program line is different from a width of the second portion of the second program line,
the first portion of the first program line is separated from the first portion of the second program line along a direction, and
along the direction, a terminal of the second portion of the first program line is located between two terminals of the first portion of the second program line.

9. The method of claim 8, further comprising:
forming a first portion of a third program line and a first portion of a fourth program line in the first conductive layer;
forming a second portion of the third program line in a fourth conductive layer above the first conductive layer; and
forming a second portion of the fourth program line in a fifth conductive layer above the first conductive layer,
wherein a width of the first portion of the third program line is smaller than a width of the second portion of the third program line, a width of the first portion of the fourth program line is smaller than a width of the second portion of the fourth program line, and
the third program line and the fourth program line have equivalent resistances that are substantially the same.

10. The method of claim 8, further comprising:
forming a third portion of the first program line in a fourth conductive layer between the first conductive layer and the second conductive layer; and
forming third portions of the second program line in continuous conductive layers between the first conductive layer and the third conductive layer.

11. A memory device, comprising:
an N-th program line configured to transmit an N-th program signal to memory cells arranged in an N-th row, wherein a first portion of the N-th program line is formed in a 1st conductive layer, and a second portion of the N-th program line is formed in an X1-th conductive layer above the 1st conductive layer;
an (N+1)-th program line configured to transmit an (N+1)-th program signal to memory cells arranged in an (N+1)-th row, wherein a first portion of the (N+1)-th program line is formed in the 1st conductive layer, and a second portion of the (N+1)-th program line is formed in an X2-th conductive layer above the 1st conductive layer;
an (N+2)-th program line configured to transmit an (N+2)-th program signal to memory cells arranged in an (N+2)-th row, wherein a first portion of the (N+2)-th program line is formed in the 1st conductive layer, and a second portion of the (N+2)-th program line is formed in an X3-th conductive layer above the 1st conductive layer; and
an (N+3)-th program line configured to transmit an (N+3)-th program signal to memory cells arranged in an (N+3)-th row, wherein a first portion of the (N+3)-th program line is formed in the 1st conductive layer, and a second portion of the (N+3)-th program line is formed in an X4-th conductive layer above the 1st conductive layer,
wherein N, X1, X2, X3 and X4 are positive integers, and X1, X2, X3 and X4 are different from one another,
a width of the first portion of the N-th program line is different from a width of the second portion of the N-th program line, and a width of the first portion of the (N+1)-th program line is different from a width of the second portion of the (N+1)-th program line, and
the X3-th conductive layer is separated from and located between the X2-th conductive layer and the X4-th conductive layer.

12. The memory device of claim 11, wherein
the width of the first portion of the N-th program line is substantially equal to at least one of the width of the first portion of the (N+1)-th program line, a width of the first portion of the (N+2)-th program line, or a width of the first portion of the (N+3)-th program line, and
the width of the first portion of the N-th program line is different from at least one of the width of the second portion of the (N+1)-th program line, the width of the second portion of the (N+2)-th program line, or a width of the second portion of the (N+3)-th program line.

13. The memory device of claim 11, wherein
a third portion of the N-th program line is formed in a 2nd conductive layer between the 1st conductive layer and the X1-th conductive layer, third portions of the (N+1)-th program line are formed in continuous conductive layers between the 1st conductive layer and the X2-th conductive layer, and the N-th program line and the (N+1)-th program line have equivalent resistances that are substantially the same.

14. The memory device of claim 13, further comprising:

at least one power line formed in the X1-th conductive layer, wherein in a layout view, one of the third portions of the (N+1)-th program line in the X1-th conductive layer is disposed between the at least one power line and the second portion of the N-th program line.

15. The memory device of claim 14, further comprising:

a plurality of power segments formed in the 1st conductive layer, wherein in a layout view, the plurality of power segments are disposed between at least two of the first portion of the N-th program line, the first portion of the (N+1)-th program line, the first portion of the (N+2)-th program line, or the first portion of the (N+3)-th program line, and the plurality of power segments and the at least one power line are configured to receive a power signal, and have sizes that are different from each other.

16. The memory device of claim 11, wherein third portions of the (N+2)-th program line are formed in a plurality of first continuous conductive layers between the 1st conductive layer and the X3-th conductive layer, fourth portions of the (N+3)-th program line are formed in a plurality of second continuous conductive layers between the 1st conductive layer and the X4-th conductive layer, and an amount of the third portions of the (N+2)-th program line is less than an amount of the fourth portions of the (N+3)-th program line.

17. The memory device of claim 16, wherein the plurality of first continuous conductive layers and the plurality of second continuous conductive layers comprise the X1-th conductive layer, in the X1-th conductive layer, one of the third portions of the (N+2)-th program line, one of the fourth portions of the (N+3)-th program line and the second portion of the N-th program line are separated from each other, in a layout view, and a size of one of the third portions of the (N+2)-th program line or one of the fourth portions of the (N+3)-th program line is smaller than a size of the second portion of the N-th program line.

18. The memory device of claim 16, wherein a length of one of the third portions of the (N+2)-th program line is different from a length of one of the fourth portions of the (N+3)-th program line.

19. The memory device of claim 11, wherein

X1 is equal to $(2\times(N-1)+3)$, X2 is equal to $(2\times(N)+3)$, X3 is equal to $(2\times(N+1)+3)$, and X4 is equal to $(2\times(N+2)+3)$.

20. The memory device of claim 11, wherein

X1 is equal to $((N-1)+3)$, X2 is equal to $(N+3)$, X3 is equal to $((N+1)+3)$, and X4 is equal to $((N+2)+3)$.

* * * * *